(12) United States Patent
Rikiishi et al.

(10) Patent No.: US 12,191,172 B2
(45) Date of Patent: Jan. 7, 2025

(54) TAPE MOUNTER

(71) Applicant: DISCO CORPORATION, Tokyo (JP)

(72) Inventors: Toshiyasu Rikiishi, Tokyo (JP); Yuuki Yasuda, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 452 days.

(21) Appl. No.: 17/643,208

(22) Filed: Dec. 8, 2021

(65) Prior Publication Data

US 2022/0208573 A1    Jun. 30, 2022

(30) Foreign Application Priority Data

Dec. 28, 2020   (JP) ................................. 2020-218949

(51) Int. Cl.
| | | |
|---|---|---|
| *H01L 21/67* | (2006.01) | |
| *B25J 9/00* | (2006.01) | |
| *B65G 1/137* | (2006.01) | |
| *H01L 21/677* | (2006.01) | |
| *H01L 21/683* | (2006.01) | |
| *H01L 21/687* | (2006.01) | |
| *H05K 13/08* | (2006.01) | |

(52) U.S. Cl.
CPC ...... *H01L 21/67132* (2013.01); *B25J 9/0096* (2013.01); *B65G 1/137* (2013.01); *H01L 21/67769* (2013.01); *H01L 21/6836* (2013.01); *H01L 21/68707* (2013.01); *H05K 13/0882* (2018.08); *B65G 2201/0297* (2013.01)

(58) Field of Classification Search
CPC ........ H01L 21/67132; H01L 21/67769; H05K 13/0882; B25J 9/0096; B65G 1/137; B65G 2201/0297
See application file for complete search history.

(56) References Cited

U.S. PATENT DOCUMENTS

| | | | |
|---|---|---|---|
| 2001/0048865 A1 | 12/2001 | Tateyama et al. | |
| 2014/0113413 A1* | 4/2014 | Yamamoto | .......... H01L 21/6836 438/118 |
| 2015/0214085 A1* | 7/2015 | Jin | ....................... B25J 15/0666 294/185 |

FOREIGN PATENT DOCUMENTS

| | | | | |
|---|---|---|---|---|
| CN | 103579048 A | * | 2/2014 | ............. B65H 29/54 |
| JP | 2014027171 A | | 2/2014 | |
| JP | 2014086532 A | | 5/2014 | |
| JP | 2015082588 A | | 4/2015 | |
| JP | 2015529979 A | | 10/2015 | |

(Continued)

OTHER PUBLICATIONS

Japanese Patent Application [JP 2020-218949 A]: English translation of Notice of Reasons for Refusal, Aug. 27, 2024 (5 pages).

*Primary Examiner* — Carson Gross
(74) *Attorney, Agent, or Firm* — Greer, Burns & Crain, Ltd.

(57) ABSTRACT

A tape mounter includes a frame delivery mechanism for delivering a ring frame, a wafer delivery mechanism for delivering a wafer, a tape affixing mechanism for affixing a dicing tape to a ring frame and a wafer and integrally combining the ring frame and the wafer with each other to turn them into a frame set, a frame cassette stage for placing a frame cassette thereon, a robot capable of removing a ring frame from the frame cassette placed on the frame cassette stage or storing the frame set into the frame cassette placed on the frame cassette stage, and a controller.

17 Claims, 10 Drawing Sheets

(56) References Cited

FOREIGN PATENT DOCUMENTS

| JP | 2019110189 A | 7/2019 |
|---|---|---|
| JP | 2019140217 A | 8/2019 |

* cited by examiner

TAPE MOUNTER

BACKGROUND OF THE INVENTION

Field of the Invention

The present invention relates to a tape mounter for affixing a tape to a ring frame and a wafer.

Description of the Related Art

A tape mounter for affixing a dicing tape to a ring frame and a wafer, as disclosed in Japanese Patent Laid-open No. 2019-110189, uses a frame delivery mechanism for holding under suction the upper surface of the ring frame to hold under suction the upper surface of an uppermost one of ring frames stacked in a frame stocker and to deliver the ring frame to a frame table (see Japanese Patent Laid-open No. 2015-082588 and Japanese Patent Laid-open No. 2019-140217).

SUMMARY OF THE INVENTION

Each time the stacked ring frames are used up, the operator replenishes the frame stocker with ring frames. However, the replenishing process poses a burden on the operator.

It is therefore an object of the present invention to provide a tape mounter that is free of a process of replenishing ring frames by the operator.

In accordance with an aspect of the present invention, there is provided a tape mounter including a frame table for holding a lower surface of a ring frame having an opening defined therein, a wafer table for holding a lower surface of a wafer within the opening in the ring frame, a frame delivery mechanism for delivering a ring frame to the frame table, a wafer delivery mechanism for delivering a wafer to the wafer table, a tape affixing mechanism for affixing a dicing tape to a ring frame and a wafer and integrally combining the ring frame and the wafer with each other to turn them into a frame set, a frame cassette stage for placing thereon a frame cassette capable of storing ring frames, a robot having a frame holder for holding a ring frame thereon and being capable of removing a ring frame from the frame cassette placed on the frame cassette stage or storing the frame set into the frame cassette placed on the frame cassette stage, and a controller. In the tape mounter, the controller performs a control process for controlling the frame holder of the robot to hold and remove a ring frame from the frame cassette on the frame cassette stage, a control process for controlling the frame delivery mechanism to receive the ring frame held by the frame holder of the robot, a control process for controlling the frame holder of the robot to receive the frame set held by the frame delivery mechanism, and a control process for controlling the frame holder of the robot to store the frame set held by the frame holder of the robot into the frame cassette on the frame cassette stage.

In accordance with another aspect of the present invention, there is provided a tape mounter including a frame table for holding a lower surface of a ring frame having an opening defined therein, a wafer table for holding a lower surface of a wafer within the opening in the ring frame, a frame delivery mechanism for delivering a ring frame to the frame table, a wafer delivery mechanism for delivering a wafer to the wafer table, a tape affixing mechanism for affixing a dicing tape to a ring frame and a wafer and integrally combining the ring frame and the wafer with each other to turn them into a frame set, a first frame cassette stage for placing thereon a frame cassette capable of storing ring frames, a second frame cassette stage that is not the first frame cassette stage, a robot having a frame holder for holding a ring frame thereon and being capable of removing a ring frame from the frame cassette placed on the first frame cassette stage or storing the frame set into the frame cassette placed on the second frame cassette stage, and a controller. In the taper mounter, the controller performs a control process for controlling the frame holder of the robot to hold and remove a ring frame from the frame cassette on the first frame cassette stage, a control process for controlling the frame delivery mechanism to receive the ring frame held by the frame holder of the robot, a control process for controlling the frame holder of the robot to receive the frame set held by the frame delivery mechanism, and a control process for controlling the frame holder of the robot to store the frame set held by the frame holder of the robot into the frame cassette on the second frame cassette stage.

Preferably, the tape mounter further includes a wafer cassette stage for placing thereon a wafer cassette capable of storing wafers, and in the tape mounter, the robot has a wafer holder for holding a wafer thereon, and the controller performs a control process for controlling the wafer holder of the robot to hold a wafer stored in the wafer cassette on the wafer cassette stage and removing the wafer from the wafer cassette and a control process for controlling the wafer delivery mechanism to receive the wafer held by the wafer holder of the robot and deliver the wafer to the wafer table.

The tape mounter according to the aspect of the present invention includes the frame cassette stage for placing thereon a frame cassette capable of storing ring frames, the robot having a frame holder for holding a ring frame thereon and being capable of removing a ring frame from the frame cassette placed on the frame cassette stage or storing a frame set into the frame cassette placed on the frame cassette stage, and the controller. In the tape mounter, the controller performs a control process for controlling the frame holder of the robot to hold and remove a ring frame from the frame cassette on the frame cassette stage, a control process for controlling the frame delivery mechanism to receive the ring frame held by the frame holder of the robot, a control process for controlling the frame holder of the robot to receive the frame set held by the frame delivery mechanism, and a control process for controlling the frame holder of the robot to store the frame set held by the frame holder of the robot into the frame cassette on the frame cassette stage. Accordingly, the tape mounter does not need to use a frame stocker which has been used in the conventional art and does not require the operator to replenish a frame stocker with ring frames. It is possible to store a frame set including a dicing tape into the frame cassette supplied with ring frames and deliver, i.e., unload and retrieve, the frame cassette from the tape mounter by use of an automatic guided vehicle (AGV) or an overhead hoist transfer (OHT) mechanism. Consequently, the operator is not required to retrieve frame sets.

The tape mounter according to the other aspect of the present invention includes the first frame cassette stage for placing thereon a frame cassette capable of storing ring frames and the second frame cassette stage that is not the first frame cassette stage. In the tape mounter, the controller performs a control process for controlling the frame holder of the robot to store the frame set held by the frame holder of the robot into the frame cassette on the second frame cassette stage. It is thus possible to store a frame set including a dicing tape into an empty frame cassette on the second frame cassette stage and deliver, i.e., unload and retrieve, the frame cassette from the tape mounter by use of an AGV or an OHT mechanism. Consequently, the operator is not required to retrieve frame sets.

In a case where the tape mounter further includes the wafer cassette stage for placing thereon a wafer cassette capable of storing wafers, the robot has a wafer holder for holding a wafer thereon, and the controller performs a control process for controlling the wafer holder of the robot to hold a wafer stored in the wafer cassette on the wafer cassette stage and removing the wafer from the wafer cassette and a control process for controlling the wafer delivery mechanism to receive the wafer held by the wafer holder of the robot and deliver the wafer to the wafer table, it is possible to produce a frame set that includes a wafer and a ring frame more smoothly in the tape mounter.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will be described hereinbelow with reference to the accompanying drawings. The present embodiment will be described in relation to a three-dimensional coordinate system including X, Y, and Z axes extending respectively along X-axis, Y-axis, and Z-axis directions. The X-axis directions extend horizontally and include +X and −X directions, and the Y-axis directions extend horizontally perpendicularly to the X-axis directions and include +Y and −Y directions. The Z-axis directions extend vertically perpendicularly to the X-axis directions and the Y-axis directions and include +Z and −Z directions.

Figure 1:
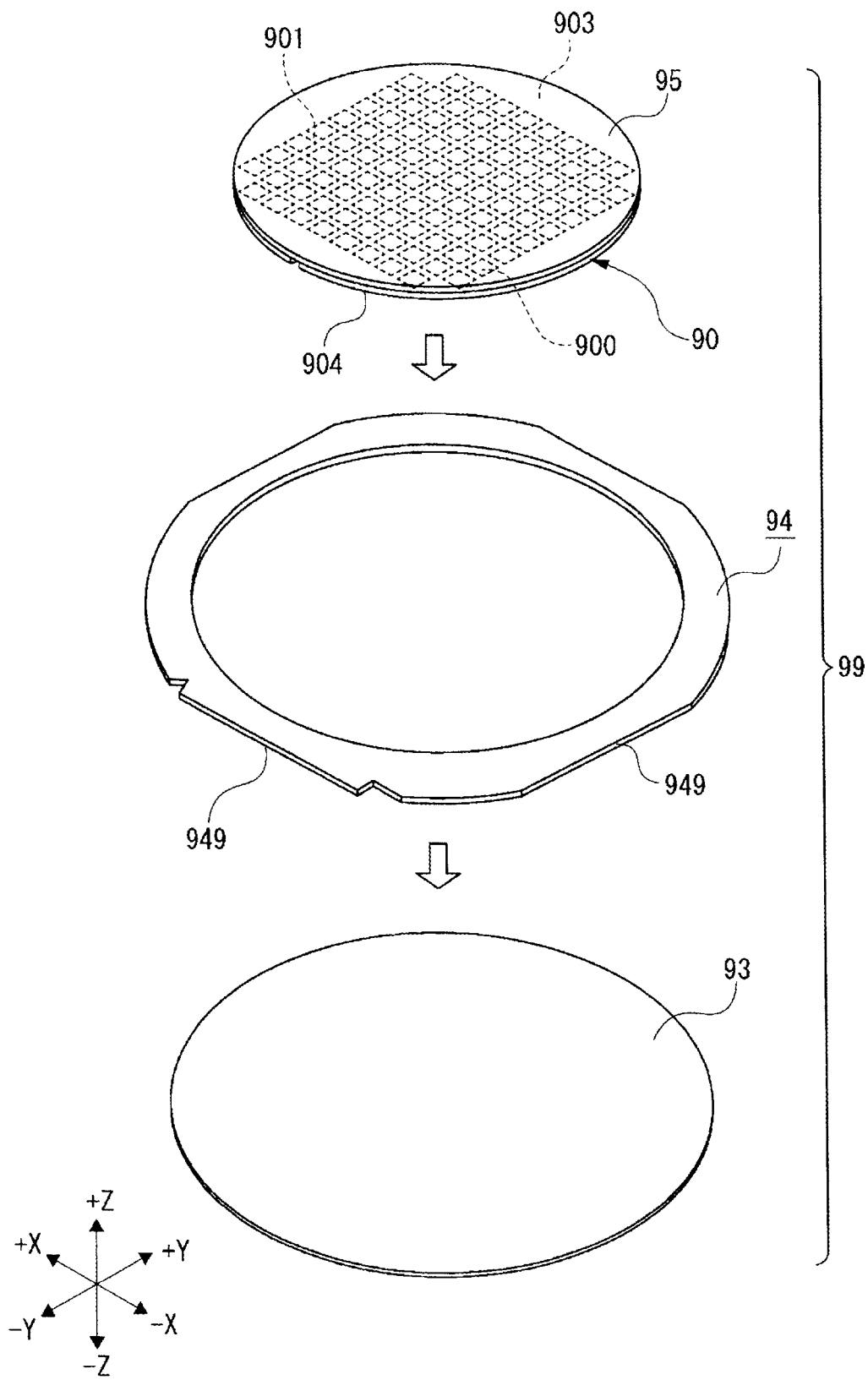
FIG. 1 is a perspective view illustrating by way of example a wafer with a protective tape affixed thereto, a ring frame, and a dicing tape.

As illustrated in FIG. 1, a wafer 90 that is used in the present embodiment is a semiconductor wafer that has a circular contour and that is made of a base material such as silicon. The wafer 90 has a face side 903 having a grid of areas demarcated thereon by a plurality of intersecting projected dicing lines 901 with a number of devices 900 formed in the respective areas. A protective tape 95 is affixed to the face side 903 over the devices 900 for protecting the face side 903 when the wafer 90 is ground, for example.

The wafer 90 may alternatively be made of gallium arsenide, sapphire, ceramic, resin, gallium nitride, silicon carbide, or the like, other than silicon, and may be free of the devices 900.

As illustrated in FIG. 1, a dicing tape 93 that is also affixed to the wafer 90 is shaped as a circular tape larger in diameter than the wafer 90 and includes a base layer made of polyethylene terephthalate (PET) resin or the like, with an adhesive layer disposed on the base layer.

Figure 2:
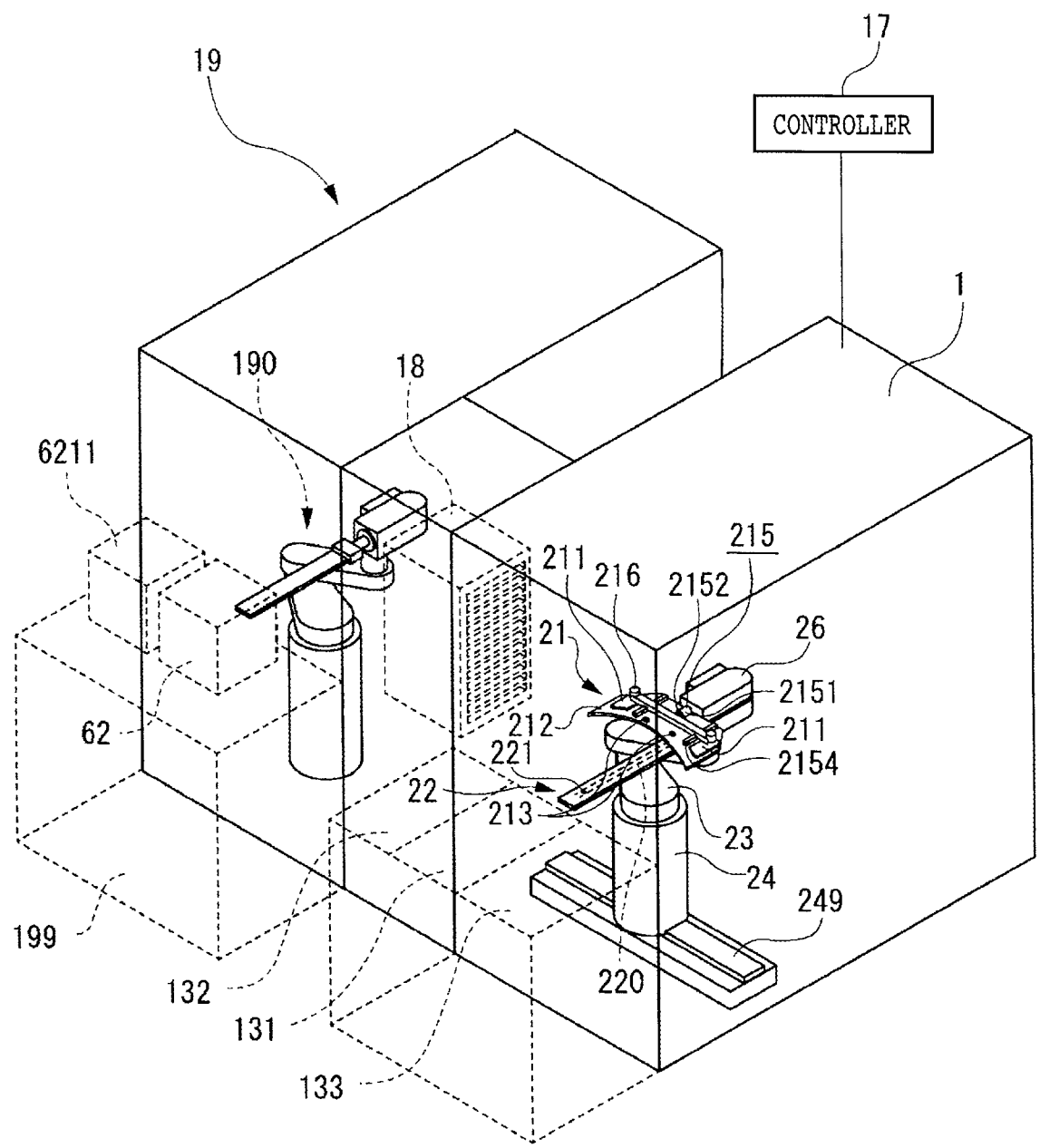
FIG. 2 is a perspective view illustrating by way of example a tape mounter according to an embodiment of the present invention, in its entirety, combined with a grinding apparatus positioned side by side.

By use of a tape mounter 1 according to the present embodiment that is illustrated in FIG. 2 and that is to be described later, an outer circumferential portion of the adhesive layer, which faces upwardly in FIG. 1, of the dicing tape 93 is affixed to a reverse side, i.e., a lower surface, of a ring frame 94 having a circular opening defined therein, in a manner to close the circular opening, and a reverse side 904 of the wafer 90 is affixed to the adhesive layer of the dicing tape 93 that is exposed in the opening in the ring frame 94. The center of the wafer 90 and the center of the opening in the ring frame 94 are substantially aligned with each other. The wafer 90 is supported by the ring frame 94. The operator can handle the wafer 90 by gripping the ring frame 94 or having the ring frame 94 held under suction. In other words, the wafer 90, the ring frame 94, and the dicing tape 93 jointly make up a frame set 99 that can be handled as one unit.

As illustrated in FIG. 2, the tape mounter 1 according to the present embodiment is combined with a grinding apparatus 19 positioned side by side, for example. The wafer 90 that has been ground and thinned to a desired thickness by the grinding apparatus 19 is housed in a wafer cassette 62 and delivered to the tape mounter 1. Thereafter, or after the thinned wafer 90 is housed in a transfer cassette 18 illustrated in FIG. 2 and received by the tape mounter 1, a dicing tape 93 is affixed to the wafer 90 and a ring frame 94 by the tape mounter 1, making up a frame set 99, and the protective tape 95 is peeled off from the face side 903 of the wafer 90 as illustrated in FIG. 1.

The transfer cassette 18 is, for example, an open cassette having a plurality of shelves for storing wafers 90 thereon, respectively.

For example, the grinding apparatus 19 and the tape mounter 1 are positioned side by side with a predetermined spacing therebetween along the X-axis directions or joined to each other in a clean room. Passages for the operator to move along, for example, are provided respectively forwardly (in the −Y direction) and rearwardly (in the +Y direction) of the grinding apparatus 19 and the tape mounter 1.

The grinding apparatus 19, which has heretofore been known in the art, is an apparatus for grinding the wafer 90 held under suction on a chuck table with rotating grindstones. The grinding apparatus 19 illustrated in FIG. 2 incorporates therein an intra-grinding apparatus robot 190 including an articulated arm that has a holding pad for holding the wafer 90 under suction thereon.

On a front side, which faces in the −Y direction, of the grinding apparatus 19, there is disposed a grinding apparatus wafer cassette stage 199 for placing thereon a pre-grinding wafer cassette 6211 that stores on respective shelves thereof a plurality of wafers 90 having respective face sides 903 to which protective tapes 95 are affixed and having respective reverse sides 904 to be ground and a wafer cassette 62 that stores ground wafers 90. The intra-grinding apparatus robot 190 delivers one at a time of the wafers 90 from the pre-grinding wafer cassette 6211 on the grinding apparatus wafer cassette stage 199 to the chuck table in the grinding apparatus 19 and also delivers a wafer 90 whose reverse side 904 has been ground into the wafer cassette 62 on the grinding apparatus wafer cassette stage 199. Alternatively, the intra-grinding apparatus robot 190 delivers one at a time of wafers 90 whose reverse sides 904 have been ground onto one of the shelves of the transfer cassette 18 disposed between the grinding apparatus 19 and the tape mounter 1.

An OHT mechanism, for example, is disposed over the grinding apparatus 19 and the tape mounter 1 in the clean room. The wafer cassette 62 that stores a plurality of ground wafers 90 on respective shelves thereof is delivered from the grinding apparatus wafer cassette stage 199 to a wafer cassette stage 133 combined with the tape mounter 1 by the OHT mechanism as illustrated in FIG. 2.

Figure 3:
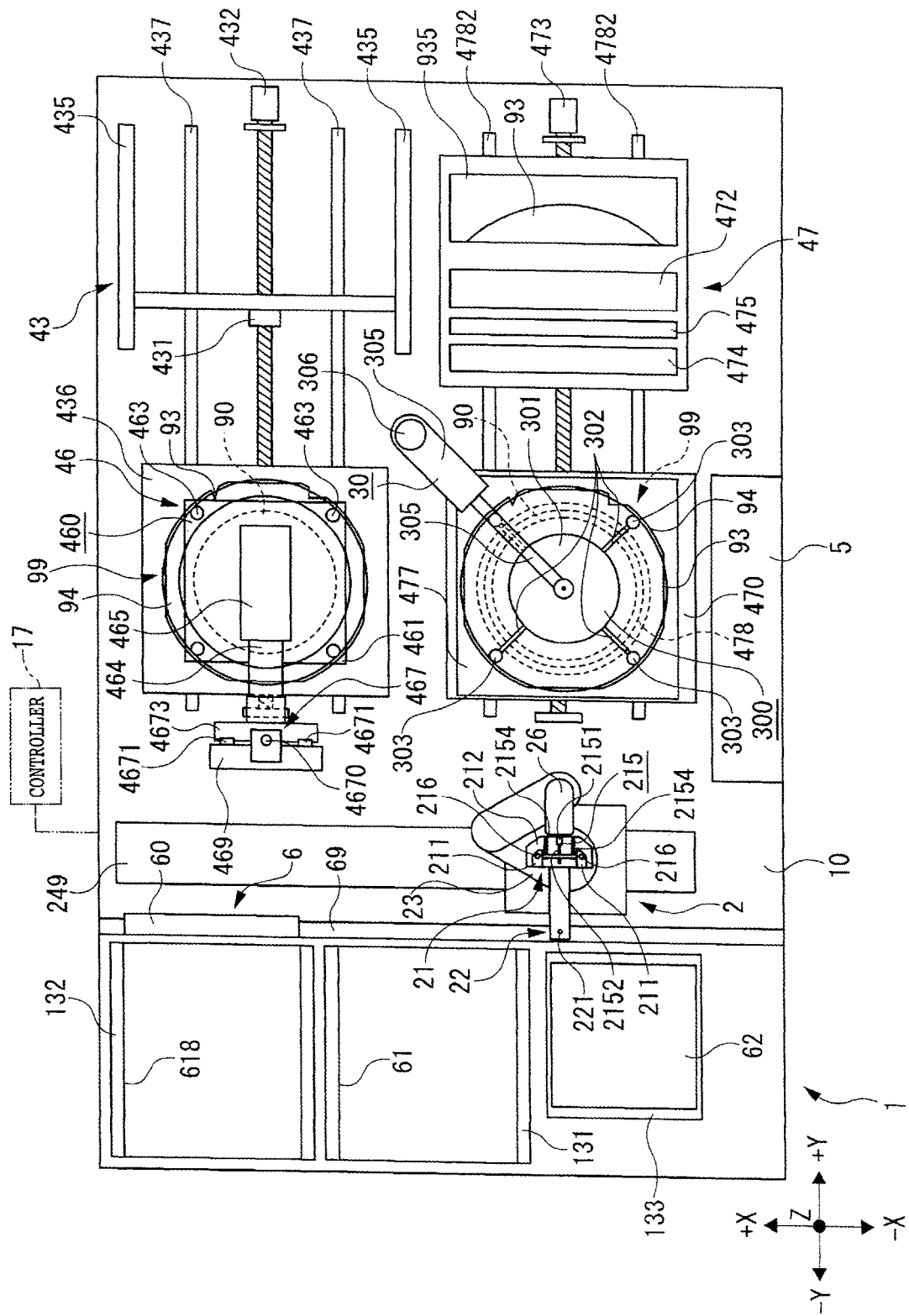
FIG. 3 is a plan view illustrating by way of example the tape mounter in its entirety.

As illustrated in FIGS. 2 and 3, a second frame cassette stage 132, a first frame cassette stage 131, and the wafer cassette stage 133 are disposed on a front side, which faces in the −Y direction, of an apparatus base 10 of the tape mounter 1 whose longitudinal directions are represented by the Y-axis directions. The second frame cassette stage 132, the first frame cassette stage 131, and the wafer cassette stage 133 are arrayed successively in the order described from the +X direction side to the −X direction side. As illustrated in FIG. 3, a frame cassette 618 that houses on respective shelves thereof the frame sets 99 of a plurality of wafers 90 with protective tapes 95 peeled off from their face sides 903 is placed on the second frame cassette stage 132. A frame cassette 61 that houses on respective shelves thereof a plurality of ring frames 94 to be used is placed on the first frame cassette stage 131. A wafer cassette 62 that houses on respective shelves thereof a plurality of wafers 90 thinned down to a desired thickness by the grinding apparatus 19 that has ground their reverse sides 904, for example, is placed on the wafer cassette stage 133.

As illustrated in FIG. 3, the tape mounter 1 includes a frame table 477 for holding the lower surface of a ring frame 94 that has an opening defined therein, a wafer table 478 for holding the protective tape 95 on the lower surface of a wafer 90 in the opening in the ring frame 94, a frame delivery mechanism 30 for delivering a ring frame 94 to the frame table 477, a wafer delivery mechanism 5 for delivering a wafer 90 to the wafer table 478, a tape affixing mechanism 47 for affixing a dicing tape 93 to a ring frame 94 and a wafer 90 to turn them into an integral frame set 99, the second frame cassette stage 132 for placing thereon a frame cassette 618 capable of housing ring frames 94, i.e., frame sets 99, the first frame cassette stage 131 for placing thereon a frame cassette 61 capable of storing ring frames 94 to be used, a robot 2 having a frame holder 21 for holding a ring frame 94 and being capable of removing a ring frame 94 from the frame cassette 61 on the first frame cassette stage 131 or storing a frame set 99 into the frame cassette 618 on the second frame cassette stage 132, and a controller 17 including a central processing unit (CPU) for controlling the components of the tape mounter 1, a storage medium such as a memory, etc.

The tape affixing mechanism 47 is disposed on a rear portion, which extends in the +Y direction, of the apparatus base 10 of the tape mounter 1. The tape affixing mechanism 47 includes a tape affixing table 470 for holding a wafer 90 and a ring frame 94 under suction, for example. The tape affixing table 470 is movable back and forth in the Y-axis directions by a ball screw mechanism 473. Specifically, the tape affixing table 470 is linearly movable back and forth in the Y-axis directions along a travel path defined by a pair of guide rails 4782. The travel path is positioned below an unreeling roller 472 for unreeling an unillustrated web-shaped sheet to which dicing tapes 93 precut to a circular shape are affixed, from a tape roll 935, a peeling plate 475 for peeling off dicing tapes 93 from the web-shaped sheet, and an affixing roller 474 rotatable about a rotational axis extending in the X-axis directions.

The tape affixing table 470 includes the frame table 477 for holding the lower surface of a ring frame 94 having a circular opening defined therein as described above and the wafer table 478 for holding the lower surface of a wafer 90 in the circular opening in the ring frame 94.

The frame table 477 and the wafer table 478 are integrally movable back and forth along the Y-axis directions. The frame table 477 surrounds the wafer table 478. Each of the frame table 477 and the wafer table 478 has a flat holding surface made of a porous material or the like and can hold an object, i.e., a ring frame 94 or a wafer 90, under suction forces generated by an unillustrated suction source, such as a vacuum generating device, held in fluid communication with the holding surface. The frame table 477 has a support surface that supports the lower surface of the ring frame 94 with a plurality of suction cups on the support surface. The suction cups hold the ring frame 94 under suction, and the support surface supports the lower surface of the ring frame 94.

As the peeling plate 475 peels off a dicing tape 93 from the web-shaped sheet unreeled from the tape roll 935 by the unreeling roller 472, the affixing roller 474 affixes the dicing tape 93 to the wafer 90 and the ring frame 94 that are held on the tape affixing table 470 that moves in one of the Y-axis directions below the affixing roller 474.

In the example illustrated in FIG. 3, the tape roll 935, the unreeling roller 472, the peeling plate 475, and the affixing roller 474 are successively arrayed from the +Y direction side to the −Y direction side. However, the tape roll 935, the unreeling roller 472, the peeling plate 475, and the affixing roller 474 may successively be arrayed from the −Y direction side to the +Y direction side.

The frame delivery mechanism 30 is disposed above the travel path along which the tape affixing table 470 is movable.

The frame delivery mechanism 30 includes a delivery pad 300, for example. The delivery pad 300 includes a base 301 shaped as a circular plate, a plurality of, e.g., four, suction cup supports 302 extending radially outwardly horizontally from the outer circumferential edge of the base 301, and a plurality of, e.g., four, suction cups 303 disposed on the lower surfaces of the respective lower ends of the suction cup supports 302, for attracting the ring frame 94 under suction. The suction cups 303 are held in fluid communication with an unillustrated suction source such as a vacuum generating device that generates attracting suction forces.

The base 301 has an upper surface attached to the distal end of a swing arm 305 that extends horizontally. The proximal end of the swing arm 305 is connected to a swing mechanism 306, which includes an electric motor, a swing shaft, etc., for rotating the swing arm 305 through 360 degrees in a horizontal plane. The swing arm 305 is also vertically movable along the Z-axis directions by an actuator or the like. The frame delivery mechanism 30 can deliver a frame set 99 from the tape affixing table 470 to a peeling table 436 of a protective tape peeling mechanism 43 to be described later.

The peeling table 436 of the protective tape peeling mechanism 43 illustrated in FIG. 3 can hold a frame set 99 under suction, for example. The peeling table 436 is disposed below a peeling member 431 that peels off a protective tape 95 from a wafer 90 when moved along one of the Y-axis directions by a peeling member moving mechanism 435 such as an electrically driven slider or the like with the peeling member 431 gripping an unillustrated peel-off tape affixed to the protective tape 95. The peeling member 431 may alternatively include a peeling clamp for peeling off the protective tape 95 from the face side 903 of the wafer 90 by directly gripping the protective tape 95.

The peel-off tape may be a heat-sealable tape that develops adhesiveness when heated, for example, but is not limited thereto.

For example, the peeling table 436 is linearly movable in the Y-axis directions along a travel path defined by a pair of guide rails 437 by drive power produced by a ball screw mechanism 432.

A frame set reverser 46 is disposed above the travel path along which the peeling table 436 is movable.

Figure 4:
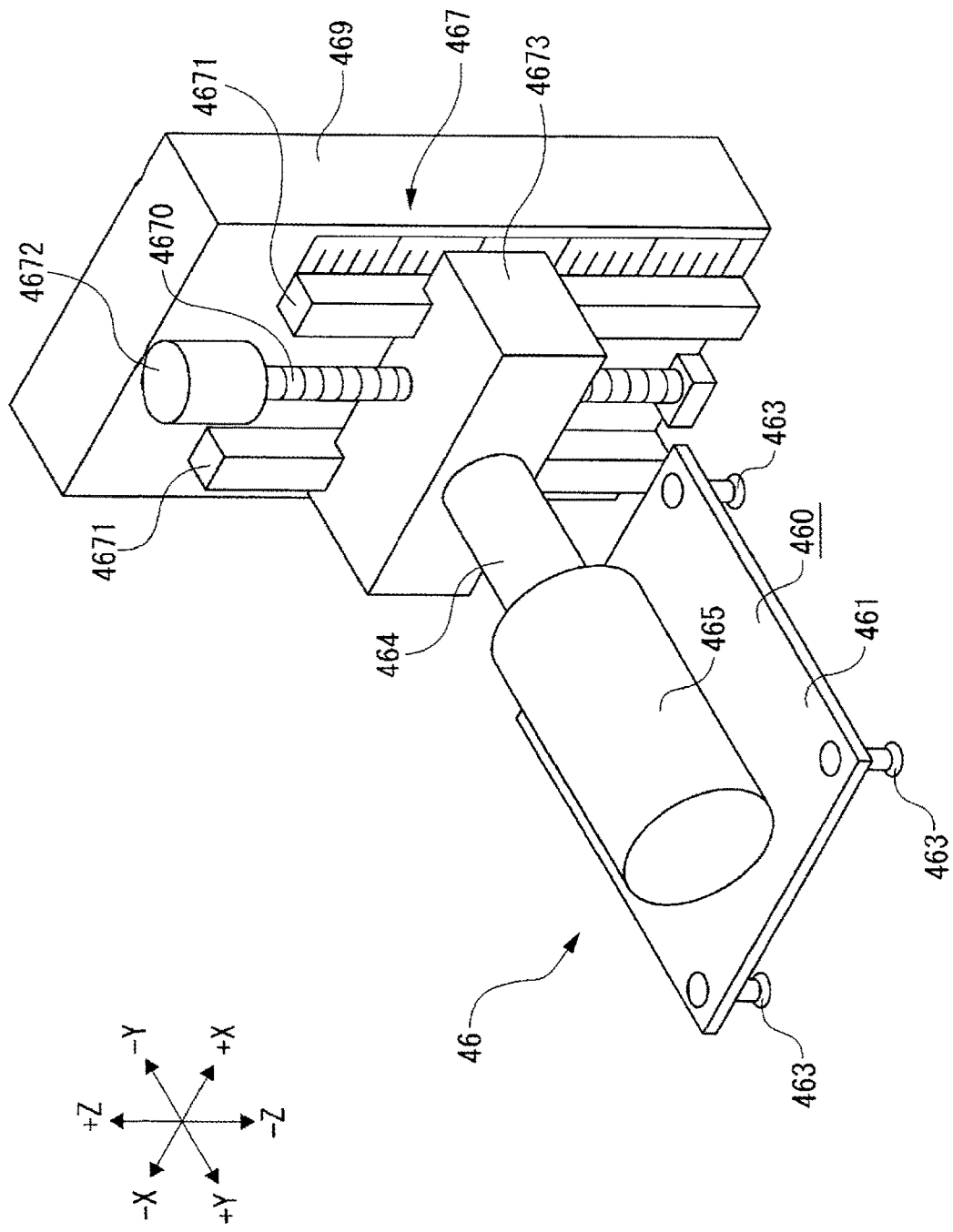
FIG. 4 is a perspective view illustrating by way of example a frame set reverser.

As illustrated in FIGS. 3 and 4, the frame set reverser 46 includes a reversing pad 460, for example, that includes a base 461 shaped as a rectangular plate and a plurality of suction cups 463 disposed respectively on the four corners of the lower surface of the base 461 for attracting a ring frame 94 under suction. The peeling table 436 can be positioned directly below the reversing pad 460.

The frame set reverser 46 further includes a reversing pad lifting and lowering mechanism 467 for lifting and lowering the reversing pad 460 along the Z-axis directions, a reversing motor 465 connected to the upper surface of the reversing pad 460, and a rotational shaft 464 that is rotatable about its central axis extending along the Y-axis directions and that has an end connected to the reversing motor 465 and another end supported on a lifting and lowering block 4673. The suction cups 463 are held in fluid communication with an unillustrated suction source that generates attracting suction forces. When the reversing motor 465 is energized, it rotates itself with respect to the rotational shaft 464 through a predetermined angle, turning the base 461 selectively to a position where a frame set 99 held under suction by the four suction cups 463 faces downwardly and a position where the frame set 99 held under suction by the four suction cups 463 faces upwardly. A reversing pad column 469 is erected on the apparatus base 10 behind the reversing pad 460 in the −Y direction. The reversing pad lifting and lowering mechanism 467 is disposed on the front surface of the reversing pad column 469 that faces in the +Y direction.

The rotational shaft 464 may be rotated by a rotary cylinder instead of the reversing motor 465.

The reversing motor 465 may be disposed on the lifting and lowering block 4673, and the reversing pad 460 may be connected to the rotational shaft 464.

The reversing pad lifting and lowering mechanism 467 includes a ball screw 4670 with its central axis extending along the Z-axis directions, a pair of guide rails 4671 that are disposed one on each side of the ball screw 4670 and that extend parallel to the ball screw 4670, an electric motor 4672 coupled to the upper end of the ball screw 4670 for rotating the ball screw 4670 about its central axis, and the lifting and lowering block 4673 having an internal nut threaded over the ball screw 4670 and a pair of side portions held in sliding contact with the respective guide rails 4671.

When the electric motor 4672 is energized, it rotates the ball screw 4670 about its central axis, causing the internal nut of the lifting and lowering block 4673 to move the lifting and lowering block 4673 back and forth along the Z-axis directions while the lifting and lowering block 4673 is being guided by the guide rails 4671. Thus, the reversing pad 460 connected to the reversing motor 465 that is coupled to the lifting and lowering block 4673 by the rotational shaft 464 is lifted and lowered along the Z-axis directions.

Figure 5:
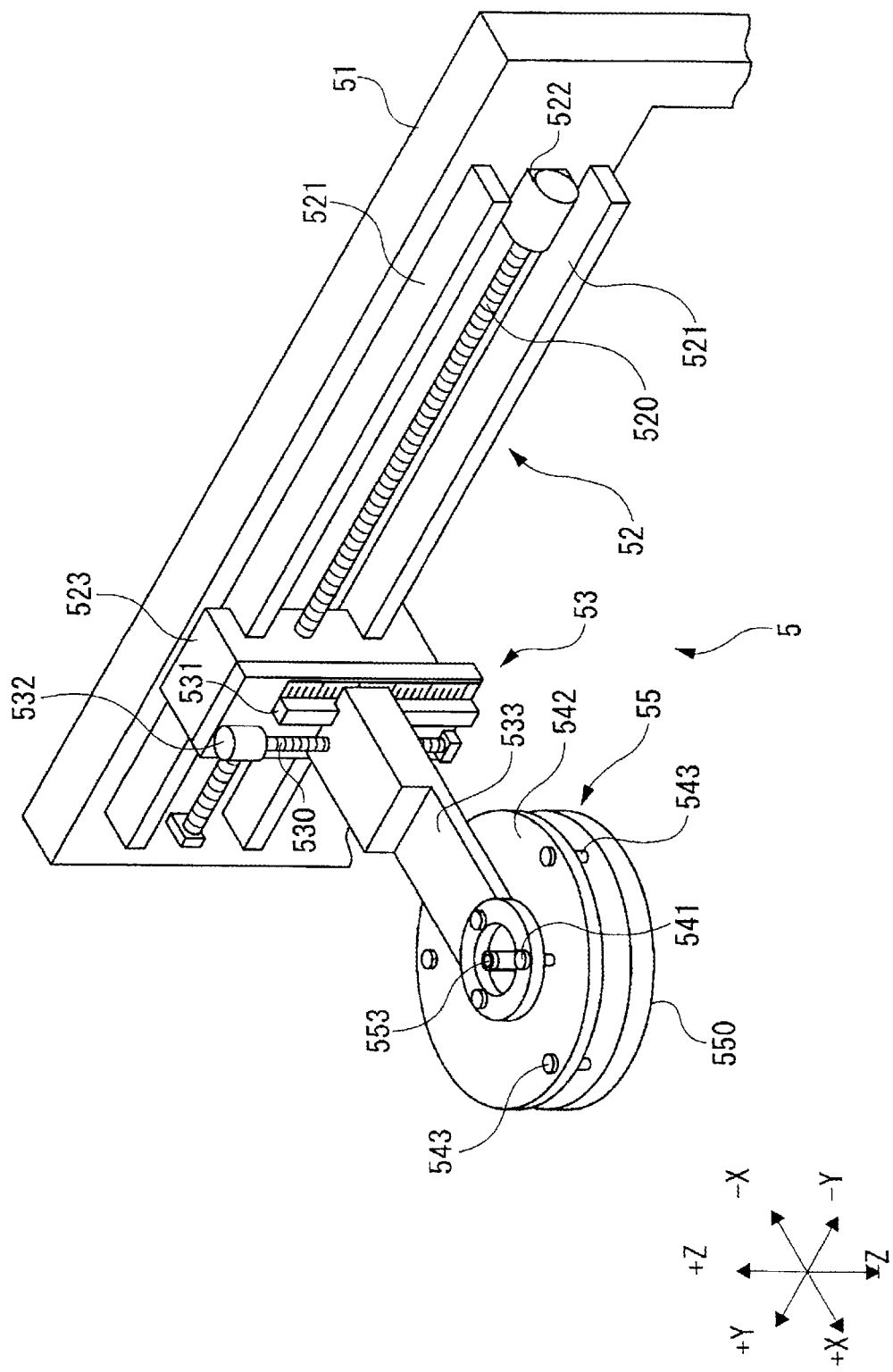
FIG. 5 is a perspective view illustrating by way of example a wafer delivery mechanism.

The wafer delivery mechanism 5 for delivering a wafer 90 to the wafer table 478, as illustrated in FIGS. 3 and 5, is disposed on the apparatus base 10 closely to the robot 2, for example. The wafer delivery mechanism 5 is movable along the Y-axis directions, for example, above the tape affixing table 470 including the frame table 477 and the wafer table 478.

The wafer delivery mechanism 5 has its structural details illustrated in FIG. 5. As illustrated in FIG. 5, the wafer delivery mechanism 5 includes, for example, a suction pad moving mechanism 52 disposed on a column 51 erected on an area of the apparatus base 10 on the −X direction side, a suction pad lifting and lowering mechanism 53 interconnecting the suction pad moving mechanism 52 and a suction pad 55, for lifting and lowering the suction pad 55, and the suction pad 55 for receiving a wafer 90 that is held by a wafer holder 22 of the robot 2.

The suction pad moving mechanism 52 includes a ball screw 520 with its central axis extending along the Y-axis directions, a pair of guide rails 521 that are disposed one on each side of the ball screw 520 and that extend parallel to the ball screw 520, an electric motor 522 coupled to an end of the ball screw 520 for rotating the ball screw 520 about its central axis, and a movable block 523 having an internal nut threaded over the ball screw 520 and a pair of side portions held in sliding contact with the respective guide rails 521. When the electric motor 522 is energized, it rotates the ball screw 520 about its central axis, causing the internal nut of the movable block 523 to move the movable block 523 linearly along the Y-axis directions while the movable block 523 is being guided by the guide rails 521. Thus, the suction pad 55 that is connected to the movable block 523 by the suction pad lifting and lowering mechanism 53 is moved along the Y-axis directions.

The suction pad lifting and lowering mechanism 53 includes a ball screw 530 with its central axis extending along the Z-axis directions, a pair of guide rails 531 that are disposed one on each side of the ball screw 530 and that extend parallel to the ball screw 530, an electric motor 532 coupled to the upper end of the ball screw 530 for rotating the ball screw 530 about its central axis, and a lifting and lowering arm 533 extending in the +X direction and having an internal nut threaded over the ball screw 530 and a pair of side portions held in sliding contact with the respective guide rails 531. The suction pad 55 is disposed on the distal end of the lifting and lowering arm 533. When the electric motor 532 is energized, it rotates the ball screw 530 about its central axis, causing the internal nut of the lifting and lowering arm 533 to move the lifting and lowering arm 533 back and forth along the Z-axis directions while the lifting and lowering arm 533 is being guided by the guide rails 531. Therefore, the suction pad 55 on the lifting and lowering arm 533 is lifted and lowered along the Z-axis directions.

The suction pad 55 has an upper surface attached to the lower surface of the distal end of the lifting and lowering arm 533 by fixing bolts 541, a spring support 542, and support pins 543 including springs or the like for absorbing shocks generated upon contact with a wafer 90. The suction pad 55 is shaped as a circular plate as viewed in plan and has a lower surface as a holding surface 550 made of a porous material for holding a wafer 90 under suction thereon. The holding surface 550 is held in fluid communication with an unillustrated suction source such as a vacuum generating device via a suction pipe 553, a joint, etc.

The wafer table 478 as illustrated in FIG. 3 is positioned below a travel path along which the suction pad 55 is linearly movable in the Y-axis directions.

Figure 6:
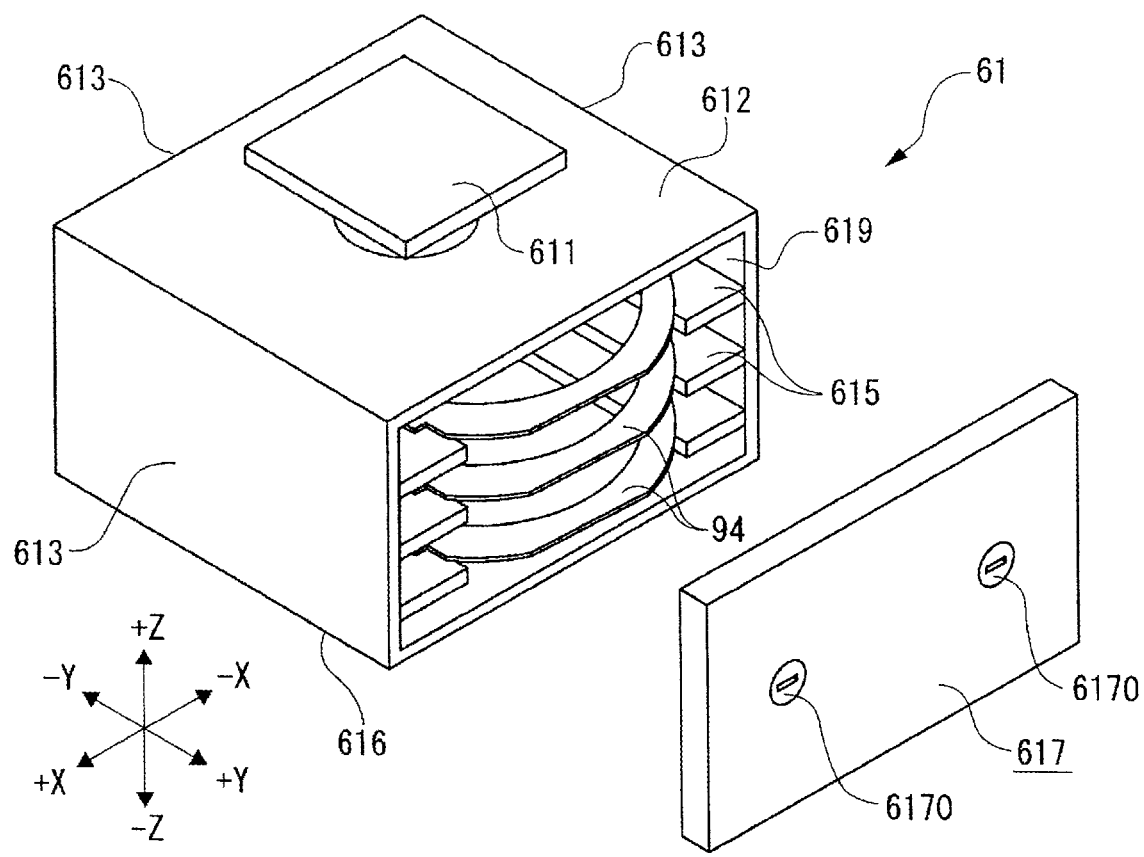
FIG. 6 is a perspective view illustrating by way of example a frame cassette.

As illustrated in FIG. 6, the frame cassette 61 that houses ring frames 94 therein is a closed-type front opening unified pod (FOUP). The frame cassette 61 includes at least an OHT engaging member 611 to be gripped by the unillustrated OHT mechanism, a top panel 612 on which the OHT engaging member 611 is mounted, a plurality of, i.e. three, side panels 613 extending downwardly, i.e., in the −Z direction, from the top panel 612, a plurality of shelves 615 mounted on the respective inner side surfaces of two of the side panels 613 that face each other along the X-axis directions, for placing ring frames 94 thereon, and a bottom panel 616 interconnecting the lower ends of the three side panels 613. For example, unillustrated handles that can be gripped by the operator may be mounted on the outer side surfaces of the side panels 613.

According to the present embodiment, in order to meet demands for higher levels of cleanness that semiconductor devices to be finally manufactured from wafers 90 are to achieve as they are required to be smaller and smaller in size, the frame cassette 61 is of the closed type to protect itself against entry of dust. However, the frame cassette according to the present invention may be an open-type cassette. Furthermore, the frame cassette 61 may be free of the OHT engaging member 611.

The frame cassette 61 has a front opening 619 that is open in the +Y direction for allowing ring frames 94 to be delivered in and out of the frame cassette 61 therethrough. The shelves 615 are spaced apart at predetermined vertical intervals in the frame cassette 61. Two of the shelves 615 that confront each other along the X-axis directions can store a ring frame 94 thereon by supporting outer circumferential portions thereof.

Figure 8:
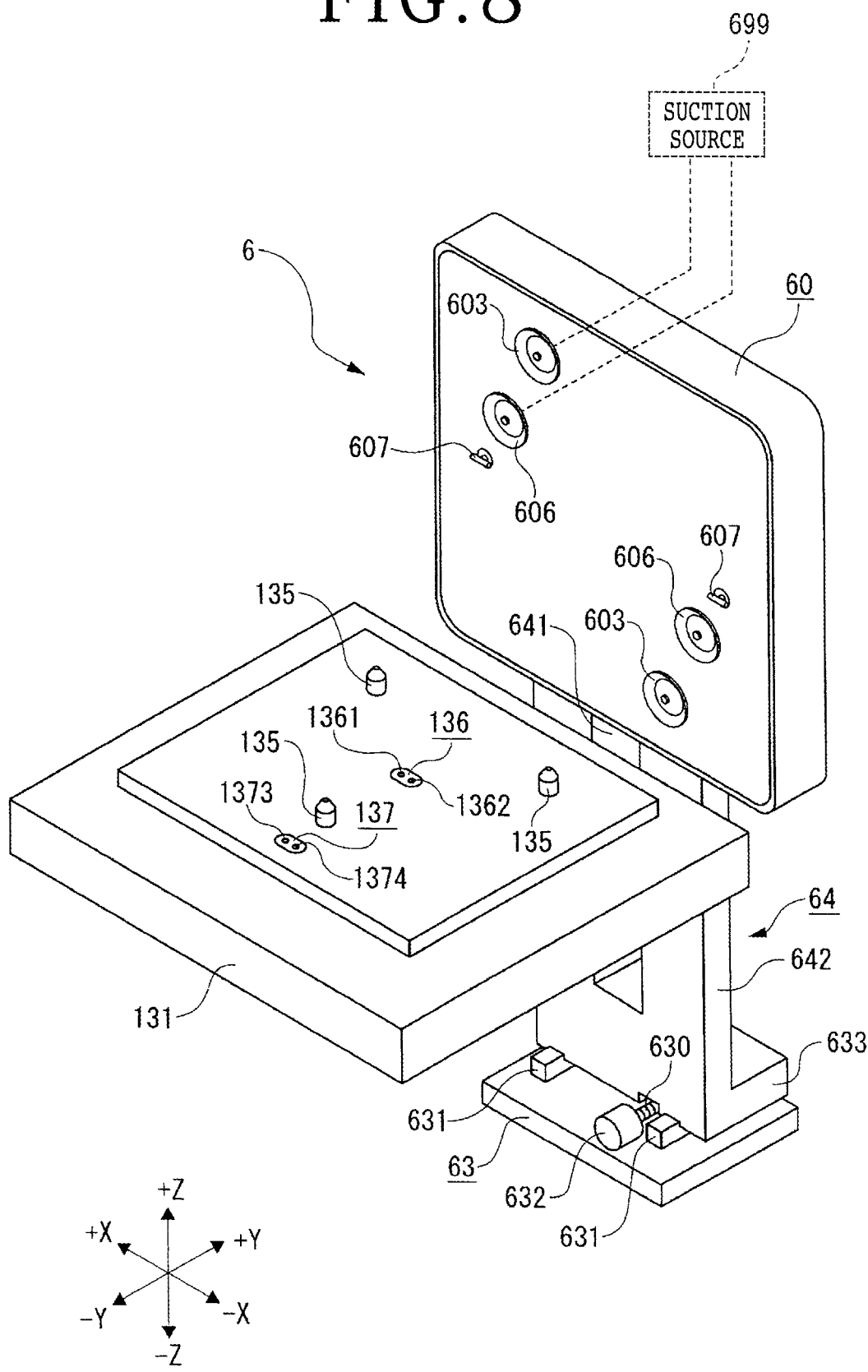
FIG. 8 is a perspective view illustrating by way of example a cassette opening and closing mechanism and a wafer cassette stage.

When the frame cassette 61 is delivered from an unillustrated, predetermined cassette supply source positioned outside of the tape mounter 1 to the first frame cassette stage 131 with the OHT engaging member 611 gripped by the OHT mechanism, the opening 619 is closed by a cassette lid 617, for example. For removing a ring frame 94 from the frame cassette 61, two opening and closing handles 607 of a cassette opening and closing mechanism 6 illustrated in FIG. 8 are inserted into respective keyholes 6170 defined in the cassette lid 617 and are then turned to open the cassette lid 617.

The OHT engaging member 611 that is erected on the top panel 612 can be hooked and held by a clamp-like gripping arm or the like of the OHT mechanism.

The frame cassette 618 is identical in structure to the frame cassette 61 illustrated in FIG. 6.

Figure 7:
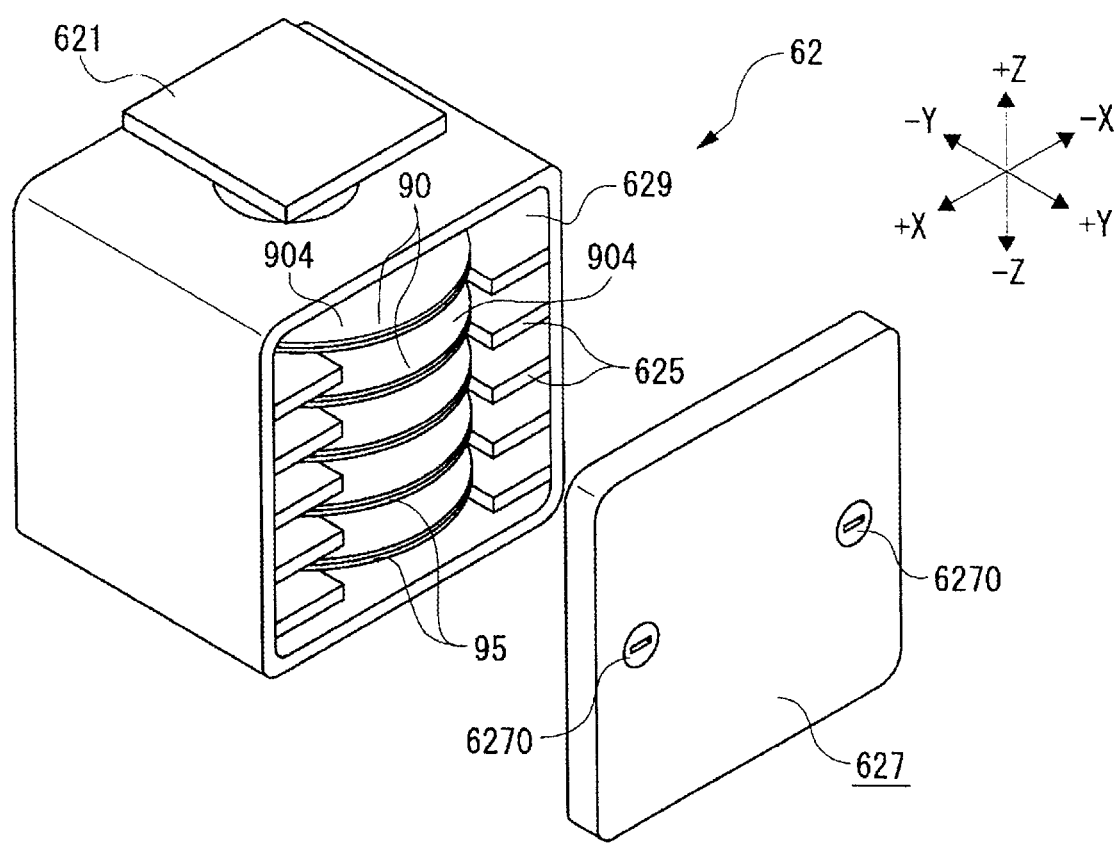
FIG. 7 is a perspective view illustrating by way of example a wafer cassette.

The wafer cassette 62 illustrated in FIG. 7 is essentially identical in structure to the frame cassette 61 illustrated in FIG. 6. The wafer cassette 62 has a front opening 629 that is open in the +Y direction for allowing wafers 90 stored on shelves 625 in a state in which outer circumferential portions thereof are supported to be delivered out of the wafer cassette 62 therethrough. The wafer cassette 62 is of a height larger than the frame cassette 61, for example, and has a width and a depth smaller than the frame cassette 61 as the wafers 90 are smaller in diameter than the ring frames 94.

When the wafer cassette 62 is delivered from an unillustrated, predetermined wafer supply source, e.g., the grinding apparatus wafer cassette stage 199 of the grinding apparatus 19, positioned outside of the tape mounter 1 to the wafer cassette stage 133 illustrated in FIG. 3 with an OHT engaging member 621 gripped by the OHT mechanism, the opening 629 is closed by a cassette lid 627. For removing a wafer 90 from the wafer cassette 62, the opening and closing handles 607 of the cassette opening and closing mechanism 6 illustrated in FIG. 8 are inserted into respective keyholes 6270 defined in a cassette lid 627 and are then turned to open the cassette lid 627.

According to the present embodiment, the frame cassette 61 and the wafer cassette 62 may, for example, have respective distinguishing marks for distinguishing them from each other. For example, the distinguishing marks are attached to the upper surfaces of the OHT engaging member 611 and the OHT engaging member 621, but they are not necessarily limited to those locations.

The cassette opening and closing mechanism 6 illustrated in FIG. 8 includes an opening and closing pad 60 shaped as a rectangular plate, for example. The opening and closing pad 60 includes two wafer FOUP suction cups 603 and two frame FOUP suction cups 606 on the front surface, which faces in the −Y direction, thereof.

For example, one of the two wafer FOUP suction cups 603 is disposed in a position higher than the two frame FOUP suction cups 606, and the other of the two wafer FOUP suction cups 603 is disposed in a position lower than the two frame FOUP suction cups 606.

Each of the two wafer FOUP suction cups 603 and the two frame FOUP suction cups 606 is held in fluid communication with a suction source 699 such as a vacuum generating device through an unillustrated fluid communication passage such as a joint or a resin tube. When the suction source 699 is actuated, it generates suction forces that are transmitted to the wafer FOUP suction cups 603 and the frame FOUP suction cups 606.

While the cassette lid 627 of the wafer cassette 62 illustrated in FIG. 7 is being held against the wafer FOUP suction cups 603, the suction source 699 is actuated to transmit suction forces to the wafer FOUP suction cups 603, so that the cassette opening and closing mechanism 6 can hold the cassette lid 627 of the wafer cassette 62. At this time, the suction forces from the suction source 699 may also be transmitted to the frame FOUP suction cups 606. In addition, while the cassette lid 617 of the frame cassette 61 illustrated in FIG. 6 is being held against the frame FOUP suction cups 606, the suction source 699 is actuated to transmit suction forces to the frame FOUP suction cups 606, so that the cassette opening and closing mechanism 6 can hold the cassette lid 617 of the frame cassette 61.

Pressure sensors may be combined with the wafer FOUP suction cups 603, for example. In a case where the pressure sensors detect contact of the wafer FOUP suction cups 603 with the cassette lid 627 of the wafer cassette 62, the pressure sensors may send signals to actuate the suction source 699, which generates and transmits suction forces to the wafer FOUP suction cups 603.

As illustrated in FIG. 8, the two opening and closing handles 607 are disposed on the front surface of the opening and closing pad 60 and laterally spaced from each other along the X-axis directions. The two opening and closing handles 607 can be inserted into the respective keyholes 6270 defined in the cassette lid 627 of the wafer cassette 62 illustrated in FIG. 7 and the respective keyholes 6170 defined in the cassette lid 617 of the frame cassette 61 illustrated in FIG. 6.

The opening and closing pad 60 houses therein an unillustrated rotary mechanism for rotating the opening and closing handles 607. The rotary mechanism has an electric motor, an encoder, etc., for example, and can rotate the opening and closing handles 607 through a required angle.

While the cassette lid 627 is engaging the wafer cassette 62 illustrated in FIG. 7 over the opening 629, the opening and closing handles 607 are inserted into the respective keyholes 6270 defined in the cassette lid 627 and are then turned in one direction to secure the cassette lid 627 to the wafer cassette 62. On the other hand, while the cassette lid 627 is being secured to the wafer cassette 62, the opening and closing handles 607 are inserted into the respective keyholes 6270 defined in the cassette lid 627 and then turned in the opposite direction to release the cassette lid 627 from the wafer cassette 62.

Similarly, while the cassette lid 617 is engaging the frame cassette 61 illustrated in FIG. 6 over the opening 619, the opening and closing handles 607 are inserted into the respective keyholes 6170 defined in the cassette lid 617 and are then turned in one direction to secure the cassette lid 617 to the frame cassette 61. On the other hand, while the cassette lid 617 is being secured to the frame cassette 61, the opening and closing handles 607 are inserted into the respective keyholes 6170 defined in the cassette lid 617 and are then turned in the opposite direction to release the cassette lid 617 from the frame cassette 61.

A Y-axis pad moving mechanism 63 for moving the opening and closing pad 60 horizontally along the Y-axis directions is disposed below the opening and closing pad 60. The Y-axis pad moving mechanism 63 includes a ball screw 630 with its central axis extending along the Y-axis directions, a pair of guide rails 631 that are disposed one on each side of the ball screw 630 and that extend parallel to the ball screw 630, an electric motor 632 coupled to the upper end of the ball screw 630 for rotating the ball screw 630 about its central axis, and a movable member 633 having an internal nut threaded over the ball screw 630 and bottom portions held in sliding contact with the respective guide rails 631. When the electric motor 632 is energized, it rotates the ball screw 630 about its central axis, causing the internal nut of the movable member 633 to move the movable member 633 along the Y-axis directions while the movable member 633 is being guided by the guide rails 631. The opening and closing pad 60 is connected to the movable member 633 by a pad lifting and lowering mechanism 64. Therefore, the opening and closing pad 60 can be moved along the Y-axis directions by the Y-axis pad moving mechanism 63.

Figure 9:
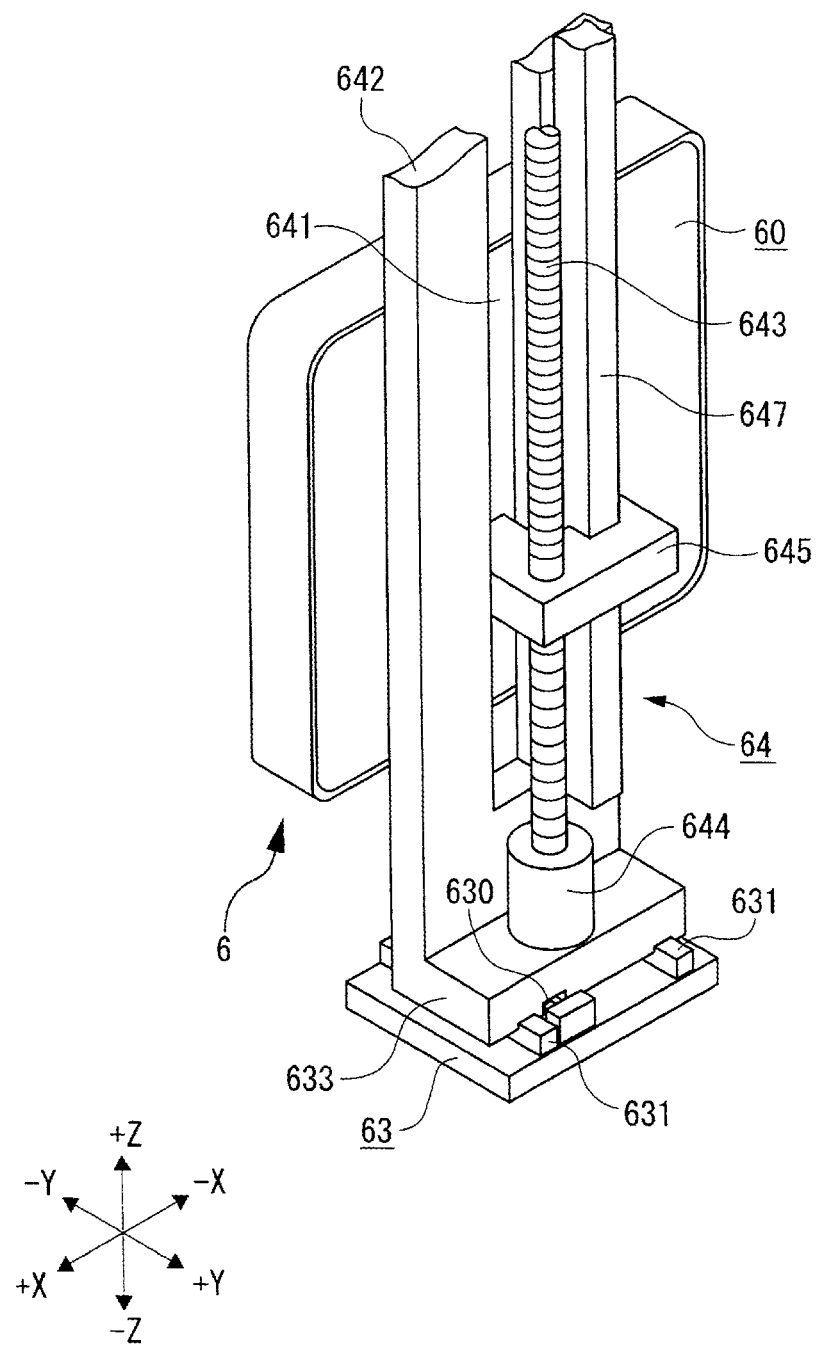
FIG. 9 is a perspective view of the cassette opening and closing mechanism as viewed from behind.

As illustrated in FIG. 9, the pad lifting and lowering mechanism 64 includes a support member 642 that is erected vertically on the movable member 633 and that has a guide groove 641 which is defined therein and which extends along the Z-axis directions, a ball screw 643 with its central axis extending along the Z-axis directions, an electric motor 644 coupled to the lower end of the ball screw 643 for rotating the ball screw 643 about its central axis, a guide rail 647 that is mounted on the support member 642 and that extends along the Z-axis directions, and a lifting and lowering block 645 having an internal nut threaded over the ball screw 643 and a side portion held in sliding contact with the guide rail 647. The opening and closing pad 60 is mounted on the front surface of the lifting and lowering block 645 that faces in the −Y direction. When the electric motor 644 is energized, it rotates the ball screw 643 about its central axis, causing the internal nut of the lifting and lowering block 645 to move the lifting and lowering block 645 along the Z-axis directions while the lifting and lowering block 645 is being guided by the guide rail 647. Therefore, the opening and closing pad 60 on the lifting and lowering block 645 can be lifted and lowered along the Z-axis directions by the pad lifting and lowering mechanism 64.

The second frame cassette stage 132, the first frame cassette stage 131, and the wafer cassette stage 133 illustrated in FIG. 3 may be lifted and lowered along the Z-axis directions by unillustrated respective elevators.

As illustrated in FIG. 3, the cassette opening and closing mechanism 6 is movable back and forth along the X-axis directions by an X-axis moving mechanism 69 such as an electrically driven slider. The opening and closing pad 60 of the cassette opening and closing mechanism 6 can be positioned in front of the cassette lid 617 of the frame cassette 618 that is placed on the second frame cassette stage 132 and that houses frame sets 99 therein, the cassette lid 617 of the frame cassette 61 that is placed on the first frame cassette stage 131 and that houses ring frames 94 to be used therein, and the cassette lid 627 of the wafer cassette 62 that is placed on the wafer cassette stage 133 and that houses therein wafers 90 with protective tapes 95 affixed thereto, successively in the order described from the +X direction side to the −X direction side.

FIG. 8 illustrates the first frame cassette stage 131 in specific detail. The first frame cassette stage 131 illustrated in FIG. 8 is essentially identical in structure to the second frame cassette stage 132 and the wafer cassette stage 133 illustrated in FIG. 3. Therefore, only the first frame cassette stage 131 will be described below.

The first frame cassette stage 131 is, for example, of a rectangular shape as viewed in plan. The first frame cassette stage 131 has three protruding members 135 on its upper surface. Each of the wafer cassette 62 and the frame cassette 61 has three unillustrated recesses defined in its lower surface for engagement in the respective protruding members 135. When the frame cassette 61, for example, is placed on the first frame cassette stage 131 such that the protruding members 135 and the recesses have their horizontal positions aligned with each other, the protruding members 135 are fitted respectively in the recesses, securing the frame cassette 61 to the first frame cassette stage 131.

A wafer cassette detection sensor 136 having a first light emitter 1361 for emitting light and a first light detector 1362 for detecting the light emitted from the first light emitter 1361 is disposed on the upper surface of the first frame cassette stage 131. In addition, a frame cassette detection sensor 137 having a second light emitter 1373 for emitting light and a second light detector 1374 for detecting the light emitted from the second light emitter 1373 is disposed on the upper surface of the first frame cassette stage 131.

For example, the wafer cassette detection sensor 136 is positioned more closely to the center of the first frame cassette stage 131 than the frame cassette detection sensor 137. Specifically, as described above, the wafer cassette 62 has a width and a depth smaller than the frame cassette 61. The wafer cassette detection sensor 136 is positioned in an area of the first frame cassette stage 131 which can be covered with both the frame cassette 61 and the wafer cassette 62, and the frame cassette detection sensor 137 is positioned outside of the area of the first frame cassette stage 131 and can be covered with only the frame cassette 61.

When the frame cassette 61 illustrated in FIG. 6 is placed on the first frame cassette stage 131, both the wafer cassette detection sensor 136 and the frame cassette detection sensor 137 are covered with the frame cassette 61. The light emitted from the second light emitter 1373 of the frame cassette detection sensor 137 is reflected by the lower surface of the frame cassette 61 and detected by the second light detector 1374. Thus, the frame cassette detection sensor 137 can determine that the cassette placed on the first frame cassette stage 131 is the frame cassette 61. On the other hand, when the wafer cassette 62, whose width and depth are smaller than the frame cassette 61, is placed on the first frame cassette stage 131, only the wafer cassette detection sensor 136 is covered with the wafer cassette 62. The second light detector 1374 of the frame cassette detection sensor 137 cannot detect the light emitted from the second light emitter 1373 as the light is not reflected by the wafer cassette 62, and the light emitted from the first light emitter 1361 of the wafer cassette detection sensor 136 is reflected by the lower surface of the wafer cassette 62 and detected by the first light detector 1362. Thus, the wafer cassette detection sensor 136 can determine that the cassette placed on the first frame cassette stage 131 is the wafer cassette 62.

The first frame cassette stage 131 and the wafer cassette stage 133, etc., may be devoid of the wafer cassette detection sensor 136 and the frame cassette detection sensor 137.

As illustrated in FIG. 3, as described above, the robot 2 included in the tape mounter 1 has the frame holder 21 for holding a ring frame 94 and is capable of removing a ring frame 94 from the frame cassette 61 on the first frame cassette stage 131 or storing a frame set 99 into the frame cassette 618 on the second frame cassette stage 132 in the present embodiment. The robot 2 according to the present embodiment also has the wafer holder 22 for holding a wafer 90 under suction thereon.

Figure 10:
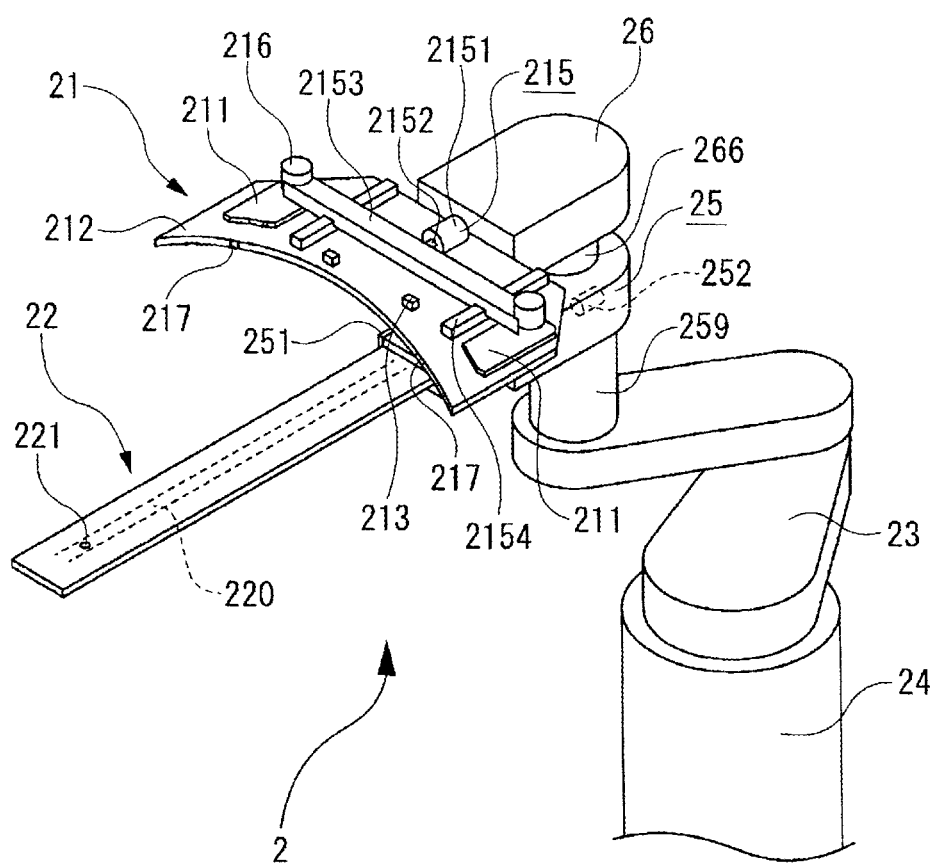
FIG. 10 is a perspective view illustrating by way of example a robot.

As illustrated in FIGS. 3 and 10, the robot 2 is an articulated or multi-joint robot and includes a horizontal holder moving mechanism 23 for horizontally moving the frame holder 21 and the wafer holder 22 and a vertical holder moving mechanism 24 that may be, for example, an electric actuator, for vertically moving the frame holder 21 and the wafer holder 22.

The horizontal holder moving mechanism 23 is of a structure for swinging, with a swinging motor, a swinging arm assembly including a plurality of plate-shaped arms and incorporating a pulley mechanism therein, for example. Specifically, the horizontal holder moving mechanism 23 operates by swinging the arms about respective rotational axes extending in the Z-axis directions, i.e., vertical directions, with rotary power generated by the swinging motor, to thereby swing the wafer holder 22, for example, in a horizontal plane defined by the X-axis directions and the Y-axis directions, and also by moving the arms from a mutually crossing state to a linearly aligned state to thereby linearly move the wafer holder 22, for example, in a horizontal plane.

The vertical holder moving mechanism 24 is connected to a lower portion of the horizontal holder moving mechanism 23. The vertical holder moving mechanism 24 moves the wafer holder 22, for example, together with the horizontal holder moving mechanism 23 upwardly and downwardly along the Z-axis directions to thereby position the wafer holder 22 at a predetermined height.

As illustrated in FIG. 3, an electrically driven slider 249 is disposed beneath the vertical holder moving mechanism 24 for moving the robot 2 in its entirety back and forth along the X-axis directions.

As illustrated in FIG. 10, a housing 25 that supports the wafer holder 22 is connected to one of the arms of the horizontal holder moving mechanism 23 by a columnar arm joint 259.

The wafer holder 22 is shaped as a substantially oblong rectangular flat plate and has a suction channel 220 which is defined therein and which extends longitudinally of the wafer holder 22. The suction channel 220 has an end held in fluid communication with an unillustrated suction source including a vacuum generating device and a compressor, etc., and another end open as a suction port 221 in an upper suction surface of the distal end of the wafer holder 22. A suction pad made of rubber resin or the like for increasing suction forces may be disposed in the suction port 221. The suction port 221 may be open in both upper and lower surfaces of the wafer holder 22, enabling the upper and lower surfaces to act as suction surfaces.

The wafer holder 22 has a rear or proximal end supported on the housing 25 by a holder 251. The housing 25 houses therein a wafer holder reversing mechanism 252 including a spindle, an electric motor, and so on. The wafer holder reversing mechanism 252 is capable of reversing the wafer holder 22 to turn the suction surface in which the suction port 221 is defined upside down. The wafer holder 22 may not be reversible upside down.

The frame holder 21 is supported on a support arm 26 and includes two upper plates 211 and a lower plate 212 for sandwiching a ring frame 94 therebetween. The lower plate 212 is in the form of a flat steel plate, for example, having a substantially arcuate edge complementary in shape to a portion of the annular outer circumferential edge of the ring frame 94.

The ring frame 94, which is of a substantially annular shape as illustrated in FIG. 1, has a plurality of (four in the illustrated example) positioning flat facets 949 defined in the outer circumferential edge thereof.

As illustrated in FIG. 10, two abutment blocks 213 for abutment against the ring frame 94 are disposed on the upper surface of the lower plate 212 that will contact the ring frame 94, at respective symmetrical positions with respect to a central line of the upper surface of the lower plate 212. Each of the abutment blocks 213 has a contour shaped as a substantially rectangular parallelepiped, and includes a flat front surface for abutment against the ring frame 94. The frame holder 21 can position the ring frame 94 in a horizontal plane by having the front surfaces of the abutment blocks 213 abut against one of the positional flat facets 949 of the ring frame 94.

A plate feeding mechanism 215 for feeding the upper plates 211 toward the ring frame 94 in the −Y direction illustrated in FIG. 10 is disposed on the upper surface of the lower plate 212. The plate feeding mechanism 215 is an air cylinder, for example, including a cylinder tube 2151 having an unillustrated piston slidably disposed therein and a piston rod 2152 that is inserted in the cylinder tube 2151 and that has an end connected to the piston. The two upper plates 211 are supported by a support bar 2153 connected to the other end of the piston rod 2152. The support bar 2153 has bottom portions loosely fitted over a pair of guide rails 2154 that are disposed on the upper surface of the lower plate 212 and that extend parallel to the piston rod 2152, so that the support bar 2153 can slide on and along the guide rails 2154.

The plate feeding mechanism 215 is not limited to an air cylinder, and may, for example, be an electric cylinder or the like.

Gripping cylinders 216 are disposed respectively on both longitudinal ends of the support bar 2153 along the X-axis directions in the illustrated example. The gripping cylinders 216 have respective piston rods movable along the Z-axis directions. The piston rods have respective lower ends connected to the respective upper surfaces of the upper plates 211, which are flat plates. Each of the upper plates 211 is shaped as a substantially oblong rectangular flat plate and has a substantially arcuate edge complementary in shape to a portion of the annular outer circumferential edge of the ring frame 94. The frame holder 21 operates by positioning the ring frame 94 between the upper plates 211 and the lower plate 212 and lowering the upper plates 211 with the gripping cylinders 216, causing the upper plates 211 and the lower plate 212 to grip the ring frame 94 vertically therebetween.

As illustrated in FIG. 10, two sensors 217 for checking whether there is a ring frame 94 or not may be disposed on the substantially arcuate edge of the lower plate 212.

The frame holder 21 is attached to the front surface of the support arm 26 that is mounted on the housing 25 that supports the wafer holder 22 by a swing shaft 266. The frame holder 21 can swing horizontally parallel to a horizontal plate with respect to the wafer holder 22 and can be spaced from the wafer holder 22.

The controller 17 illustrated in FIG. 3 includes a processor such as a CPU for performing arithmetic and processing operations according to control programs and a storage device such as a memory that stores the control programs or software and various kinds of data. The controller 17 has functions that can be performed by the processor according to the software stored in the storage device. The controller 17 is electrically connected by unillustrated wired or wireless communication links to the components of the tape mounter 1 including the electrically driven slider 249 for moving the robot 2 along the X-axis directions, the cassette opening and closing mechanism 6, the robot 2, the frame delivery mechanism 30, the frame set reverser 46, and so on. The controller 17 can perform motor control, sequence control, etc., on the components of the tape mounter 1. Various sensors including the wafer cassette detection sensor 136 and the frame cassette detection sensor 137 illustrated in FIG. 8, etc., send detection signals to the controller 17.

An example of operation of the tape mounter 1 for forming a frame set 99 that can be diced after the wafer 90 illustrated in FIG. 1 has been ground by the grinding apparatus 19 illustrated in FIG. 2 will be described below.

The pre-grinding wafer cassette 6211 that stores a plurality of wafers 90 to be processed is introduced from a cassette supply source into the grinding apparatus 19 by the unillustrated OHT mechanism and is placed on the grinding apparatus wafer cassette stage 199 of the grinding apparatus 19.

The wafer 90 illustrated in FIG. 1 with the protective tape 95 affixed to the face side 903 thereof is stored in the pre-grinding wafer cassette 6211. The pre-grinding wafer cassette 6211 is of an identical structure to the wafer cassette 62 illustrated in FIG. 7.

The grinding apparatus 19 also includes the cassette opening and closing mechanism 6 illustrated in FIG. 8. The cassette opening and closing mechanism 6 opens the cassette lid of the pre-grinding wafer cassette 6211 illustrated in FIG. 2 on the grinding apparatus wafer cassette stage 199, allowing a wafer 90 to be delivered from the pre-grinding wafer cassette 6211. The intra-grinding apparatus robot 190 holds and delivers the wafer 90 from the pre-grinding wafer cassette 6211 and places the wafer 90 on the chuck table, which holds the wafer 90 under suction thereon. The rotating grindstones are then lowered to the reverse side 904 of the wafer 90, grinding the wafer 90. After the wafer 90 has been ground to a desired thickness, the grindstones are lifted away from the wafer 90, whereupon the grinding process on the wafer 90 is completed.

The intra-grinding apparatus robot 190 delivers the ground wafer 90 from the chuck table and stores the wafer 90 into the wafer cassette 62, which is empty, on the grinding apparatus wafer cassette stage 199. Alternatively, the intra-grinding apparatus robot 190 delivers the ground wafer 90 from the chuck table and stores the wafer 90 into the transfer cassette 18. The intra-grinding apparatus robot 190 may store the ground wafer 90 back into the pre-grinding wafer cassette 6211.

For example, all of the wafers 90 stored in the pre-grinding wafer cassette 6211 are successively ground in the manner described above, and the successively ground wafers 90 are stored in the wafer cassette 62. Thereafter, the unillustrated OHT mechanism delivers the wafer cassette 62 that stores the ground wafers 90 with the protective tapes 95 affixed thereto from the grinding apparatus wafer cassette stage 199 to the wafer cassette stage 133 of the tape mounter 1 and places the wafer cassette 62 on the wafer cassette stage 133.

In the tape mounter 1 illustrated in FIG. 3, a wafer 90 is delivered to the wafer table 478 according to one of two processes belonging to respective first and second categories.

According to the process in the first category, the wafer holder 22 of the robot 2 holds a ground wafer 90 stored in the wafer cassette 62 or the pre-grinding wafer cassette 6211 on the wafer cassette stage 133 and removes the ground wafer 90 from the wafer cassette 62 or the pre-grinding wafer cassette 6211. Thereafter, the wafer delivery mechanism 5 receives the wafer 90 held by the wafer holder 22 of the robot 2 and delivers the wafer 90 to the wafer table 478.

According to the process in the second category, the robot 2 removes a ground wafer 90 from the transfer cassette 18, and thereafter the wafer delivery mechanism 5 receives the wafer 90 held by the wafer holder 22 of the robot 2 and delivers the wafer 90 to the wafer table 478.

The robot 2 may also function as a wafer delivery mechanism for delivering a wafer 90 removed from the wafer cassette 62 or the pre-grinding wafer cassette 6211 or a wafer 90 removed from the transfer cassette 18 directly to the wafer table 478.

The process in the first category will be described below.

When the wafer cassette 62 that houses ground wafers 90 is placed on the wafer cassette stage 133 illustrated in FIG. 3, for example, the wafer cassette detection sensor 136 illustrated in FIG. 8 detects the wafer cassette 62. In response to the detection signal from the wafer cassette detection sensor 136, the controller 17 controls the cassette opening and closing mechanism 6. The X-axis moving mechanism 69 moves the cassette opening and closing mechanism 6 in the −X direction and positions the opening and closing pad 60 in front of the wafer cassette 62 on the wafer cassette stage 133. Further, the pad lifting and lowering mechanism 64 is moved along one of the Z-axis directions to align the height of the keyholes 6270 in the cassette lid 627, illustrated in FIG. 7, of the wafer cassette 62 on the wafer cassette stage 133 with the height of the opening and closing handles 607 of the opening and closing pad 60.

Then, the controller 17 controls the Y-axis pad moving mechanism 63 illustrated in FIG. 8 to move the opening and closing pad 60 an appropriate distance in the −Y direction. The wafer cassette 62 and the opening and closing pad 60 move toward each other until the opening and closing handles 607 enter the respective keyholes 6270 in the cassette lid 627. When the opening and closing handles 607 have entered the respective keyholes 6270, the front surface in the −Y direction of the opening and closing pad 60 and the cassette lid 627 are held in contact with each other. Then, the suction source 699 connected to the wafer FOUP suction cups 603 is actuated to generate suction forces, which are transmitted to the wafer FOUP suction cups 603 to hold the cassette lid 627 under suction thereon.

Thereafter, the rotary mechanism housed in the opening and closing pad 60 is actuated to turn the opening and closing handles 607 and remove the cassette lid 627 from the wafer cassette 62. The Y-axis pad moving mechanism 63 moves the cassette lid 627 held under suction by the wafer FOUP suction cups 603 in the +Y direction, thereby spacing the cassette lid 627 away from the wafer cassette 62. Then, the opening and closing pad 60 holding the cassette lid 627 under suction is lowered and retracted from the front side of the opening 629 in the wafer cassette 62.

Then, the controller 17 illustrated in FIG. 13 controls the robot 2. Specifically, the electrically driven slider 249 illustrated in FIG. 3 moves the robot 2 in the −X direction to position the robot 2 in front of the wafer cassette 62 placed on the wafer cassette stage 133 with its opening 629 kept open. The horizontal holder moving mechanism 23 turns the wafer holder 22 to an angular position where the wafer holder 22 faces the front of the opening 629 in the wafer cassette 62, so that the longitudinal directions, i.e., the Y-axis directions, of the wafer holder 22 are aligned with the direction along which wafers 90 can be inserted into and removed from the wafer cassette 62. Moreover, the vertical holder moving mechanism 24 vertically moves and positions the wafer holder 22 into alignment with the height of a wafer 90 to be handled that is stored on one of the shelves 625 of the wafer cassette 62.

For example, the wafer holder reversing mechanism 252 illustrated in FIG. 10 reverses the wafer holder 22 upside down to set the suction surface of the wafer holder 22 in which the suction port 221 is defined, into a state where the suction surface faces upwardly.

Then, the wafer holder 22 enters the wafer cassette 62 through the opening 629 to a predetermined position therein in the −Y direction. The wafer holder 22 is positioned below the center of the wafer 90.

Further, the wafer holder 22 is lifted until the suction surface thereof is brought into contact with the protective tape 95 affixed to the downwardly facing face side 903 of the wafer 90. The unillustrated suction source is actuated to generate suction forces, which are transmitted through the suction channel 220 to the suction port 221 to act on the wafer 90. The wafer 90 is now held under suction on the wafer holder 22 beneath the wafer 90, with the reverse side 904 facing upwardly.

Then, the wafer holder 22 that is holding the wafer 90 under suction thereon is moved out of the wafer cassette 62, so that the wafer 90 is delivered from the wafer cassette 62 by the robot 2.

The robot 2 with its wafer holder 22 holding the wafer 90 under suction delivers the wafer 90 from the wafer cassette 62. The controller 17 then performs a control process for controlling the wafer delivery mechanism 5 to receive the wafer 90 from the wafer holder 22 of the robot 2 and deliver the wafer 90 to the wafer table 478.

Specifically, under the control of the controller 17, the horizontal holder moving mechanism 23 horizontally moves, i.e., swings, the wafer holder 22 holding the wafer 90. The suction pad moving mechanism 52 of the wafer delivery mechanism 5 illustrated in FIG. 5 moves the suction pad 55 along the Y-axis directions to position the wafer 90 held under suction by the wafer holder 22 and the suction pad 55 into alignment with each other in a horizontal plane. The center of the suction pad 55 and the center of the wafer 90 are brought into substantial alignment with each other, whereupon the wafer 90 is positioned directly below the suction pad 55.

The suction pad lifting and lowering mechanism 53 lowers the suction pad 55 in the −Z direction to a vertical position where the holding surface 550 of the suction pad 55 contacts the reverse side 904 of the wafer 90, whereupon the suction pad 55 stops being lowered. Suction forces generated by the unillustrated suction source are transmitted to the holding surface 550 of the suction pad 55, causing the holding surface 550 to attract and hold the reverse side 904 of the wafer 90 under suction. When the wafer 90 is held under suction on the suction pad 55, the controller 17 controls the robot 2 to stop holding the wafer 90 under suction. As a result, a state in which the wafer 90 has been transferred to the wafer delivery mechanism 5 is realized.

When the controller 17 controls the suction pad moving mechanism 52 and the suction pad lifting and lowering mechanism 53, the wafer delivery mechanism 5 places the wafer 90 held under suction on the suction pad 55 on the wafer table 478 of the tape affixing table 470 illustrated in FIG. 3 such that the centers of the wafer 90 and the wafer table 478 are substantially aligned with each other. The wafer 90 is held under suction on the wafer table 478 with the reverse side 904 exposed upwardly.

The process in the second category for delivering the wafer 90 to the wafer table 478 in the tape mounter 1 will be described below.

Ground wafers 90 are delivered by the intra-grinding apparatus robot 190 illustrated in FIG. 2 to the respective shelves of the transfer cassette 18 disposed between the grinding apparatus 19 and the tape mounter 1, and the controller 17 illustrated in FIG. 3 controls the robot 2. The electrically driven slider 249 moves the robot 2 in the +X direction and positions the robot 2 in front of the transfer cassette 18. The horizontal holder moving mechanism 23 turns the wafer holder 22 to an angular position where the wafer holder 22 faces the front of the transfer cassette 18, so that the longitudinal directions, i.e., the Y-axis directions, of the wafer holder 22 are aligned with the direction along which wafers 90 can be inserted into and removed from the transfer cassette 18. Moreover, the vertical holder moving mechanism 24 vertically moves and positions the wafer holder 22 in alignment with the height of a wafer 90 to be handled that is stored on one the shelves of the transfer cassette 18.

Then, the wafer holder 22 is moved in the +X direction and enters the transfer cassette 18 to a predetermined position therein. The wafer holder 22 is positioned below the center of the wafer 90.

Further, the wafer holder 22 is lifted until the suction surface thereof is brought into contact with the protective tape 95 affixed to the downwardly facing face side 903 of the wafer 90 in the transfer cassette 18. The wafer 90 is now held under suction from below by the wafer holder 22 to which suction forces generated by the suction source are transmitted. The wafer 90 held under suction on the wafer holder 22 has the reverse side 904 facing upwardly.

Then, the wafer holder 22 holding the wafer 90 under suction is moved out of the transfer cassette 18, and the wafer 90 is delivered from the transfer cassette 18 by the robot 2. Subsequently, the wafer 90 is transferred from the wafer holder 22 to the wafer delivery mechanism 5 and then delivered to the wafer table 478 by the wafer delivery mechanism 5 in substantially the same manner as that in the process according to the first category.

According to the process in the first category or the process in the second category, the robot 2 that has transferred the wafer 90 to the wafer delivery mechanism 5 delivers a ring frame 94 to the frame delivery mechanism 30 concurrently while the wafer delivery mechanism 5 is delivering the wafer 90 to the wafer table 478. Specifically, the controller 17 performs a control process for controlling the frame holder 21 of the robot 2 to hold and remove a ring frame 94 from the frame cassette 61 on the first frame cassette stage 131 and a control process for controlling the frame delivery mechanism 30 to receive the ring frame 94 held by the frame holder 21 of the robot 2.

For example, the unillustrated OHT mechanism has delivered the frame cassette 61 housing ring frames 94 to be used from the supply source and placed the frame cassette 61 on the first frame cassette stage 131. The frame cassette detection sensor 137 illustrated in FIG. 8 detects the frame cassette 61. In response to the detection signal from the frame cassette detection sensor 137, the controller 17 controls the cassette opening and closing mechanism 6 to remove the cassette lid 617 from the frame cassette 61. Since the cassette opening and closing mechanism 6 operates in the same fashion as when the cassette lid 627 is removed from the wafer cassette 62, the operation of the cassette opening and closing mechanism 6 will be omitted from description. The opening and closing pad 60 holding the cassette lid 627 under suction is lowered and retracted from the front side of the opening 619 in the frame cassette 61 illustrated in FIG. 6.

Then, the controller 17 controls the robot 2. Specifically, the electrically driven slider 249 illustrated in FIG. 3 moves the robot 2 in the +X direction and positions the robot 2 in front of the frame cassette 61 placed on the first frame cassette stage 131 with its opening 619 kept open. Moreover, in order to prevent the wafer holder 22 from impeding the entry of the frame holder 21 into the frame cassette 61, the frame holder 21 illustrated in FIG. 10 swings about the swing shaft 266 away from the wafer holder 22 until the direction in which the frame holder 21 protrudes, i.e., the direction in which the upper plates 211 travel, extends perpendicularly to the longitudinal directions of the wafer holder 22, for example.

Further, the horizontal holder moving mechanism 23 turns the frame holder 21 to an angular position where the frame holder 21 faces the front of the opening 619 in the frame cassette 61. In addition, the vertical holder moving mechanism 24 positions the frame holder 21 at the height of a ring frame 94 to be handled that is stored on one of the shelves 615 of the frame cassette 61.

For example, the frame holder 21 is positioned such that the central line of the upper surface of the lower plate 212 and the diameter of the ring frame 94 in the frame cassette 61 are substantially aligned with each other. When the frame holder 21 is thus positioned, the front surfaces of the abutment blocks 213 of the frame holder 21 illustrated in FIG. 10 face one of the positional flat facets 949 of the ring frame 94 illustrated in FIG. 1.

Then, the frame holder 21 is moved toward the ring frame 94 in the −Y direction as illustrated in FIG. 10 until the front surfaces of the abutment blocks 213 abut against one of the positional flat facets 949 of the ring frame 94. When the front surfaces of the abutment blocks 213 abut against one of the positional flat facets 949 of the ring frame 94, the frame holder 21 is positioned with respect to the ring frame 94 and stops being moved.

Moreover, the plate feeding mechanism 215 illustrated in FIG. 10 moves the upper plates 211 in the −Y direction over the lower plate 212 until the distal ends of the upper plates 211 in the −Y direction illustrated in FIG. 10 reach the position of the substantially arcuate edge of the lower plate 212. Thereafter, the frame holder 21 is lifted in the +Z direction until the upper surface of the lower plate 212 contacts the lower surface of the ring frame 94. Then, the gripping cylinders 216 lower the upper plates 211 until the upper plates 211 and the lower plate 212 vertically grip the ring frame 94, whereupon the process of holding the ring frame 94 by the frame holder 21 is completed.

Further, the controller 17 illustrated in FIG. 3 controls the robot 2 and the frame delivery mechanism 30 to transfer the ring frame 94 from the robot 2 to the frame delivery mechanism 30. Specifically, the horizontal holder moving mechanism 23 horizontally moves, i.e., swings, the frame holder 21 holding the ring frame 94, and the swing mechanism 306 of the frame delivery mechanism 30 swings the delivery pad 300 to position the ring frame 94 held by the frame holder 21 and the delivery pad 300 with respect to each other in a horizontal plane. The center of the delivery pad 300 and the center of the ring frame 94 are brought into substantial alignment with each other, whereupon the ring frame 94 is positioned directly below the delivery pad 300.

After the delivery pad 300 has been lowered to a vertical position where the suction cups 303 thereof contact the upper surface of the ring frame 94, the delivery pad 300 stops being lowered at the vertical position. Then, the delivery pad 300 attracts the upper surface of the ring frame 94 under suction forces transmitted from the unillustrated suction source to the suction cups 303. When the delivery pad 300 holds the ring frame 94 under suction thereon, a control process for canceling the gripping of the ring frame 94 by the frame holder 21 is carried out, resulting in transferring the ring frame 94 from the robot 2 to the frame delivery mechanism 30.

The controller 17 controls the frame delivery mechanism 30 to place the ring frame 94 held under suction by the frame delivery mechanism 30 on the frame table 477 of the tape affixing table 470 such that their centers are substantially aligned with each other. The ring frame 94 is then held under suction on the frame table 477. The wafer 90 is now placed in the opening in the ring frame 94 such that the center of the wafer 90 is substantially aligned with the center of the opening in the ring frame 94. The face side 903 of the wafer 90 illustrated in FIG. 1 with the protective tape 95 affixed thereto has been held under suction on the wafer table 478, and the reverse side 904 of the wafer 90 faces upwardly. The reverse side 904 of the wafer 90 and the upper surface of the ring frame 94 are positioned at substantially the same height.

Then, the web-shaped sheet is unreeled from the tape roll 935 set unreelably near the unreeling roller 472 toward the peeling plate 475 by the unreeling roller 472 illustrated in FIG. 3. The peeling plate 475 peels off the dicing tape 93 from the web-shaped sheet while at the same time the affixing roller 474 rotates at a predetermined rotational speed. Further, the ball screw mechanism 473 moves the tape affixing table 470 in the +Y direction, causing the affixing roller 474 to press the dicing tape 93 against the upper surface of the ring frame 94 held under suction on the frame table 477 and the reverse side 904 of the wafer 90 held under suction on the wafer table 478 from the outer circumferential sides thereof.

When the tape affixing table 470 is moved in the +Y direction to a predetermined position where the tape affixing table 470 passes the affixing roller 474 while the affixing roller 474 is pressing the dicing tape 93 to the ring frame 94 and the wafer 90, the dicing tape 93 is affixed to the wafer 90 and the ring frame 94. In this manner, a frame set 99 where the wafer 90 and the ring frame 94 are integrally joined by the dicing tape 93 is produced.

Then, the frame delivery mechanism 30 holds the upper surface of the ring frame 94 of the frame set 99 under suction, is then lifted and turned in a horizontal plane to deliver the frame set 99 from the tape affixing table 470, and positions the frame set 99 above the reversing pad 460 of the frame set reverser 46. The wafer 90 of the frame set 99 has the face side 903 that is protected by the protective tape 95 and that faces downwardly.

The reversing pad 460 is set in a state where the four suction cups 463 face upwardly. The reversing pad lifting and lowering mechanism 467 lifts the reversing pad 460 to bring the suction cups 463 into contact with the lower surface of the ring frame 94 of the frame set 99.

The unillustrated suction source is actuated to produce suction forces, which are transmitted to the suction cups 463 to cause the suction cups 463 to attract the lower surface of the ring frame 94 under suction, whereupon the frame set 99 is held under suction by the frame set reverser 46. Then, the frame delivery mechanism 30 releases the frame set 99 and is spaced from the frame set 99.

Then, the reversing motor 465 is energized to rotate itself with respect to the rotational shaft 464 through a predetermined angle, turning the base 461 and the frame set 99 held under suction by the four suction cups 463 upside down. The face side 903 of the wafer 90 with the protective tape 95 affixed thereto faces upwardly, and the frame set 99 is positioned below and held under suction on the reversing pad 460.

The peeling table 436 is moved in the −Y direction by the ball screw mechanism 432 and positioned below the reversing pad 460 that is holding the frame set 99 under suction thereon. Then, the reversing pad lifting and lowering mechanism 467 lowers the reversing pad 460 to place the frame set 99 onto the peeling table 436 while the center of the wafer 90 of the frame set 99 and the center of the peeling table 436 are being substantially aligned with each other. Then, the frame set 99 is held under suction on the peeling table 436. The reversing pad 460 is lifted away from the frame set 99, and the face side 903, protected by the protective tape 95, of the wafer 90 of the frame set 99 faces upwardly.

The controller 17 controls the peeling member moving mechanism 435 to move the peeling member 431 along one of the Y-axis directions and also controls the ball screw mechanism 432 to move the peeling table 436 along one of the Y-axis directions, positioning the outer circumferential portion of the protective tape 95 affixed to the face side 903, i.e., a device surface, of the wafer 90 directly below the peeling member 431. Then, the peeling member 431 affixes the peel-off tape to the protective tape 95. The peeling member 431 and the peeling table 436 are moved along the Y-axis directions relatively to each other, peeling off the protective tape 95 from the face side 903 from an outer circumferential edge of the wafer 90 toward the center thereof and then from the center to an opposite outer circumferential edge of the wafer 90.

After the protective tape 95 has completely been peeled off from the wafer 90 of the frame set 99, the peeling table 436 is positioned below the reversing pad 460 of the frame set reverser 46. The wafer 90 of the frame set 99 has the reverse side 904 that is protected by the dicing tape 93 and that faces downwardly.

The reversing pad 460 is set in a state where the four suction cups 463 face downwardly. The reversing pad lifting and lowering mechanism 467 lowers the reversing pad 460 to bring the suction cups 463 into contact with the upper surface of the ring frame 94 of the frame set 99. Then, the frame set 99 is held under suction by the frame set reverser 46, and the peeling table 436 releases the frame set 99.

Then, the reversing pad 460 is turned upside down to turn the frame set 99 held under suction by the four suction cups 463 upside down, making it possible for the frame delivery mechanism 30 to hold the frame set 99 under suction from above. The frame delivery mechanism 30 is turned to an angular position above the frame set 99 held under suction by the reversing pad 460. For example, the reversing pad lifting and lowering mechanism 467 lifts the reversing pad 460 to bring the side of the ring frame 94 to which the dicing tape 93 is affixed into contact with the suction cups 303 of the frame delivery mechanism 30. Then, while the center of the frame set 99 and the center of the delivery pad 300 are being substantially aligned with each other, the frame set 99 is held under suction by the frame delivery mechanism 30. The reversing pad 460 is lowered away from the frame set 99.

The frame delivery mechanism 30 may directly hold the frame set 99 under suction while the face side 903 of the wafer 90 on the peeling table 436 is facing upwardly.

Then, the controller 17 performs a control process for controlling the frame holder 21 of the robot 2 to receive the frame set 99 held by the frame delivery mechanism 30. Specifically, the controller 17 controls the robot 2 to cause the horizontal holder moving mechanism 23 to turn the frame holder 21 and also to cause the swing mechanism 306 of the frame delivery mechanism 30 illustrated in FIG. 3 to turn the delivery pad 300 holding the frame set 99 under suction, positioning the frame set 99 held by the frame delivery mechanism 30 and the frame holder 21 with respect to each other in a horizontal plane. Thereafter, the frame holder 21 holds the ring frame 94 of the frame set 99 in the same manner as the frame holder 21 holds the ring frame 94 in the frame cassette 61 as described above. Therefore, the holding of the ring frame 94 of the frame set 99 by the frame holder 21 will be omitted from description. After the frame holder 21 has held the ring frame 94, the frame delivery mechanism 30 releases the ring frame 94.

Then, the controller 17 performs a control process for storing the frame set 99 held by the frame holder 21 of the robot 2 into the frame cassette 618, which is empty, on the second frame cassette stage 132, for example. That is, the controller 17 performs a control process for controlling the frame holder 21 of the robot 2 to store the frame set 99 held by the frame holder 21 of the robot 2 into the frame cassette 618 on the second frame cassette stage 132.

The electrically driven slider 249 illustrated in FIG. 3 moves the robot 2 in the +X direction and positions the robot 2 in front of the frame cassette 618. The horizontal holder moving mechanism 23 turns the frame holder 21 to an angular position in front of the opening in the frame cassette 618. The vertical holder moving mechanism 24 positions the frame holder 21 at the height of one, to be handled, of the shelves of the frame cassette 618. The frame holder 21 enters the frame cassette 618, places the frame set 99 on the shelf, and is retracted out of the frame cassette 618.

The controller 17 may perform a control process for storing, one at a time, the frame set 99 held by the frame holder 21 of the robot 2 on the empty shelf 615 of the frame cassette 61 placed on the first frame cassette stage 131.

When frame sets 99 are stored one by one on the shelves of the frame cassette 618 and the frame cassette 618 becomes full, the unillustrated OHT mechanism delivers the frame cassette 618 from the second frame cassette stage 132 to an unillustrated cutting apparatus or the like. The cutting apparatus then divides a wafer 90 of a frame set 99 removed from the frame cassette 618 into individual device chips.

As described above, the tape mounter 1 according to the present embodiment includes the first frame cassette stage 131 for placing thereon the frame cassette 61 capable of storing ring frames 94, the robot 2 having the frame holder 21 for holding a ring frame 94 and being capable of removing a ring frame 94 from the frame cassette 61 on the first frame cassette stage 131 or storing a frame set 99 into the frame cassette 618, and the controller 17. The controller 17 performs a control process for controlling the frame holder 21 of the robot 2 to hold and remove a ring frame 94 from the frame cassette 61 on the first frame cassette stage 131, a control process for controlling the frame delivery mechanism 30 to receive the ring frame 94 held by the frame holder 21 of the robot 2, a control process for controlling the frame holder 21 of the robot 2 to receive the frame set 99 held by the frame delivery mechanism 30, and a control process for controlling the frame holder 21 of the robot 2 to store the frame set 99 held by the frame holder 21 of the robot 2 into the frame cassette 61. The tape mounter 1 does not need to use a frame stocker and does not require the operator to replenish a frame stocker with ring frames 94. Specifically, as disclosed in Japanese Patent Laid-open No. 2015-082588 and Japanese Patent Laid-open No. 2019-140217, it has heretofore been customary for an AGV, an OHT mechanism, or the like to deliver a wafer cassette 62 storing wafers 90 and a cassette storing frame sets 99 each having a ring frame 94 and a wafer 90 that are integrally joined by a dicing tape 93. According to the embodiment, the cassette that has heretofore been used to deliver only frame sets 99 is given a new application, and the AGV or the OHT mechanism is used to deliver the frame cassette 61 storing the ring frames 94 and supply the ring frames 94 to the tape mounter 1. Consequently, the conventional process performed by the operator to replenish ring frames 94 is made unnecessary.

Further, since the controller 17 performs a control process for storing the frame set 99 held by the frame holder 21 of the robot 2 into the frame cassette 618 placed on the second frame cassette stage 132 or a control process for storing the frame set 99 held by the frame holder 21 of the robot 2 into the frame cassette 61 on the first frame cassette stage 131, it is possible to store a frame set 99 with a dicing tape 93 affixed thereto into the frame cassette 61 supplied with ring frames 94 or the frame cassette 618 that is empty, and deliver the frame cassette 61 or the frame cassette 618 from the tape mounter 1 with use of the AGV or the OHT mechanism. Consequently, the operator is not required to retrieve frame sets 99.

Moreover, the tape mounter 1 includes the wafer cassette stage 133 for placing thereon the wafer cassette 62 storing wafers 90 therein. The robot 2 includes the wafer holder 22 for holding a wafer 90, and the controller 17 performs a control process for controlling the wafer holder 22 of the robot 2 to hold a wafer 90 stored in the wafer cassette 62 on the wafer cassette stage 133 and remove the wafer 90 from the wafer cassette 62 and a control process for controlling the wafer delivery mechanism 5 to receive the wafer 90 held by the wafer holder 22 of the robot 2 and deliver the wafer 90 to the wafer table 478. It is thus possible to produce a frame set 99 that includes a wafer 90 and a ring frame 94 more smoothly in the tape mounter 1.

The tape mounter according to the present invention is not limited to the details and features according to the above embodiment, and may be reduced to practice in various different forms and details within the scope of the invention. The components of the tape mounter 1 and the grinding apparatus 19 illustrated in the accompanying drawings are not limited to the illustrated configurations, and may appropriately be changed and modified insofar as such changes and modifications can achieve the advantages of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A tape mounter comprising:
a base;
a frame table disposed on the base for holding a lower surface of a ring frame having an opening defined therein;
a wafer table disposed on the base for holding a lower surface of a wafer within the opening in the ring frame;
a frame delivery mechanism for delivering a ring frame to the frame table;
a wafer delivery mechanism for delivering a wafer to the wafer table;
a tape affixing mechanism for affixing a dicing tape to a ring frame and a wafer and integrally combining the ring frame and the wafer with each other to turn them into a frame set;
a frame cassette stage for placing thereon a frame cassette capable of storing ring frames, the frame cassette stage being disposed on the base;
a robot having a frame holder for holding a ring frame thereon and being capable of removing a ring frame from the frame cassette placed on the frame cassette stage or storing the frame set into the frame cassette placed on the frame cassette stage; and
a controller,
wherein the controller performs
a control process for
controlling the frame holder of the robot to hold and remove a ring frame from the frame cassette on the frame cassette stage,
a control process for controlling the frame delivery mechanism to receive the ring frame held by the frame holder of the robot,
a control process for controlling the frame holder of the robot to receive the frame set held by the frame delivery mechanism, and
a control process for controlling the frame holder of the robot to store the frame set held by the frame holder of the robot into the frame cassette on the frame cassette stage.

2. The tape mounter according to claim 1, further comprising:
a wafer cassette stage for placing thereon a wafer cassette capable of storing wafers, the wafer cassette stage being disposed on the base,
wherein the robot has a wafer holder for holding a wafer thereon, and
the controller performs a control process for controlling the wafer holder of the robot to hold a wafer stored in the wafer cassette on the wafer cassette stage and removing the wafer from the wafer cassette, and a control process for controlling the wafer delivery mechanism to receive the wafer held by the wafer holder of the robot and deliver the wafer to the wafer table.

3. The tape mounter according to claim 2, wherein the frame holder of the robot comprises upper and lower plates for sandwiching a ring frame therebetween and a ring frame sensor for detecting whether a ring frame is being held by the frame holder of the robot;

the wafer holder of the robot has a longitudinal direction and wherein the frame holder and the wafer holder are rotatable relative to each other such that the longitudinal direction of the wafer holder may be rotated away from a direction in which a ring frame is received in the frame holder.

4. The tape mounter according to claim 2, wherein after the wafer delivery mechanism has received the wafer held by the wafer holder of the robot, the robot delivers a ring frame to the frame delivery mechanism concurrently while the wafer delivery mechanism is delivering the wafer to the wafer table.

5. A tape mounter comprising:

a base;

a frame table disposed on the base for holding a lower surface of a ring frame having an opening defined therein;

a wafer table disposed on the base for holding a lower surface of a wafer within the opening in the ring frame;

a frame delivery mechanism for delivering a ring frame to the frame table;

a wafer delivery mechanism for delivering a wafer to the wafer table;

a tape affixing mechanism for affixing a dicing tape to a ring frame and a wafer and integrally combining the ring frame and the wafer with each other to turn them into a frame set;

a first frame cassette stage for placing thereon a first frame cassette capable of storing ring frames, the first frame cassette stage being disposed on the base;

a second frame cassette stage for placing thereon a second frame cassette, wherein the second frame cassette stage is not the first frame cassette stage, the second frame cassette stage being disposed on the base;

a robot having a frame holder for holding a ring frame thereon and being capable of removing a ring frame from the first frame cassette placed on the first frame cassette stage or storing the frame set into the second frame cassette placed on the second frame cassette stage; and a controller, wherein the controller performs a control process for controlling the frame holder of the robot to hold and remove a ring frame from the first frame cassette on the first frame cassette stage, a control process for controlling the frame delivery mechanism to receive the ring frame held by the frame holder of the robot, a control process for controlling the frame holder of the robot to receive the frame set held by the frame delivery mechanism, and a control process for controlling the frame holder of the robot to store the frame set held by the frame holder of the robot into the second frame cassette on the second frame cassette stage.

6. The tape mounter according to claim 5, further comprising:

a wafer cassette stage for placing thereon a wafer cassette capable of storing wafers, the wafer cassette stage being disposed on the base, wherein the robot has a wafer holder for holding a wafer thereon, and the controller performs a control process for controlling the wafer holder of the robot to hold a wafer stored in the wafer cassette on the wafer cassette stage and removing the wafer from the wafer cassette, and a control process for controlling the wafer delivery mechanism to receive the wafer held by the wafer holder of the robot and deliver the wafer to the wafer table.

7. The tape mounter according to claim 6, wherein the frame holder of the robot comprises upper and lower plates for sandwiching a ring frame therebetween and a ring frame sensor for detecting whether a ring frame is being held by the frame holder of the robot;

the wafer holder of the robot has a longitudinal direction and wherein the frame holder and the wafer holder are rotatable relative to each other such that the longitudinal direction of the wafer holder may be rotated away from a direction in which a ring frame is received in the frame holder.

8. The tape mounter according to claim 6, wherein after the wafer delivery mechanism has received the wafer held by the wafer holder of the robot, the robot delivers a ring frame to the frame delivery mechanism concurrently while the wafer delivery mechanism is delivering the wafer to the wafer table.

9. The tape mounter according to claim 5, wherein the tape affixing mechanism comprises a tape affixing table moveable parallel to a first direction and an unreeling roller for unreeling a sheet to which dicing tapes precut to a circular shape are affixed from a tape roll, a peeling plate for peeling off dicing tapes from the sheet, and an affixing roller.

10. The tape mounter according to claim 9, wherein the tape affixing table comprises the frame table for holding the lower surface of a ring frame having a circular opening defined therein and the wafer table for holding the lower surface of a wafer in the circular opening in the ring frame;

wherein the frame table and the wafer table are integrally movable back and forth along the first direction.

11. The tape mounter according to claim 10, wherein the wafer delivery mechanism is movable parallel to the first direction above the tape affixing table including the frame table and the wafer table.

12. The tape mounter according to claim 9, wherein the frame table has a support surface that supports the lower surface of the ring frame with a plurality of suction cups on the support surface.

13. The tape mounter according to claim 9, wherein as the peeling plate peels off a dicing tape from the sheet unreeled from the tape roll by the unreeling roller, the affixing roller affixes the dicing tape to the wafer and the ring frame that are held on the tape affixing table that moves parallel to the first direction below the affixing roller.

14. The tape mounter according to claim 9, wherein the frame delivery mechanism is disposed above a travel path along which the tape affixing table is movable.

15. The tape mounter according to claim 9, wherein the frame delivery mechanism includes a delivery pad, the delivery pad including a deliver pad base shaped as a circular plate, a plurality of suction cup supports extending radially outwardly horizontally from an outer circumferential edge of the delivery pad base, and a plurality of suction cups disposed on lower surfaces of respective lower ends of the suction cup supports, for attracting the ring frame under suction, and the delivery pad base having an upper surface attached to a distal end of a swing arm that extends horizontally, a proximal end of the swing arm being connected to a swing mechanism for rotating the swing arm, wherein the swing arm is also vertically movable.

16. The tape mounter according to claim 5, wherein the first frame cassette stage has a plurality of protruding members on an upper surface thereof, and wherein the first frame cassette has a corresponding plurality of recesses defined in a lower surface thereof for engagement in the respective protruding members of the first frame cassette stage, wherein when the first frame cassette is placed on the first frame cassette stage the protruding members and the recesses have their horizontal positions aligned with each other and the protruding members are fitted respectively in the recesses, securing the first frame cassette to the first frame cassette stage.

17. The tape mounter according to claim 5, further comprising a frame cassette detection sensor for detecting when the first frame cassette is placed on the first frame cassette stage.

* * * * *